US012796089B2

(12) United States Patent
Shin et al.

(10) Patent No.: US 12,796,089 B2
(45) Date of Patent: Nov. 10, 2026

(54) DISPLAY DEVICE

(71) Applicant: Samsung Display Co., LTD., Yongin-si (KR)

(72) Inventors: Dong Hee Shin, Yongin-si (KR); Sun Kwun Son, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 636 days.

(21) Appl. No.: 18/173,723

(22) Filed: Feb. 23, 2023

(65) Prior Publication Data

US 2024/0006422 A1 Jan. 4, 2024

(30) Foreign Application Priority Data

Jul. 4, 2022 (KR) ........................ 10-2022-0081900

(51) Int. Cl.
*H10D 86/60* (2025.01)
*H10D 86/40* (2025.01)
*H10H 20/857* (2025.01)
*H10W 90/00* (2026.01)

(52) U.S. Cl.
CPC ........... *H10D 86/60* (2025.01); *H10D 86/443* (2025.01); *H10H 20/857* (2025.01); *H10W 90/00* (2026.01)

(58) Field of Classification Search
CPC .... H10D 86/60; H10D 86/443; H01L 25/167; H10H 20/857; H10W 90/00
See application file for complete search history.

(56) References Cited

U.S. PATENT DOCUMENTS

| | | | | |
|---|---|---|---|---|
| 12,453,214 B2 | 10/2025 | Cha et al. | | |
| 2021/0134877 A1* | 5/2021 | Kim | H10H 29/142 | |
| 2021/0335883 A1* | 10/2021 | Park | G09G 3/32 | |
| 2022/0069165 A1 | 3/2022 | Shin et al. | | |
| 2022/0069167 A1* | 3/2022 | Lee | H10H 20/8312 | |
| 2022/0139962 A1* | 5/2022 | Jeong | H10K 59/131 | 257/88 |
| 2022/0181522 A1* | 6/2022 | Moon | H10H 20/8316 | |
| 2023/0261143 A1* | 8/2023 | Cha | H01L 23/525 | 257/72 |

FOREIGN PATENT DOCUMENTS

| | | | |
|---|---|---|---|
| KR | 10-2022-0037015 A | 3/2022 | |
| KR | 10-2022-0039914 A | 3/2022 | |
| WO | WO-2022059986 A1 * | 3/2022 | H10D 86/40 |

* cited by examiner

*Primary Examiner* — Jeff W Natalini
*Assistant Examiner* — Rose Keagy
(74) *Attorney, Agent, or Firm* — Womble Bond Dickinson (US) LLP

(57) ABSTRACT

A display device includes: a substrate; a first transistor on the substrate; first and second electrodes on the first transistor and extending in one direction and spaced apart from each other; a light emitting element on the first electrode and the second electrode; and a first connection electrode in contact with one end of the light emitting element and a second connection electrode in contact with another end of the light emitting element. The first electrode and the second electrode are spaced apart from the first transistor, and the first connection electrode is connected to the first transistor and the first electrode.

20 Claims, 13 Drawing Sheets

DISPLAY DEVICE

CROSS-REFERENCE TO RELATED APPLICATION

This application claims priority to and the benefit of Korean Patent Application No. 10-2022-0081900, filed on Jul. 4, 2022, in the Korean Intellectual Property Office, the entire contents of which are herein incorporated by reference.

BACKGROUND

1. Field

Aspects of embodiments of the present disclosure relate to a display device.

2. Description of the Related Art

As the information society develops, the demand for a display device for displaying an image in various forms is increasing. For example, display devices have been applied to various electronic devices, such as smartphones, digital cameras, laptop computers, navigation devices, and smart televisions.

The display device may be a flat panel display device, such as a liquid crystal display device, a field emission display device, or an organic light emitting display device. From among the flat panel display devices, the light emitting display device may include a light emitting element in which each pixel of a display panel may emit light by itself (a so-called "self-emissive pixel"), thereby displaying an image without a backlight unit providing light to the display panel. The light emitting element may be an organic light emitting diode that uses an organic material as a light emitting material and an inorganic light emitting diode that uses an inorganic material as a light emitting material.

SUMMARY

Embodiments of the present disclosure provide a display device having reduced defects caused by short circuits of electrodes.

However, aspects of the present disclosure are not limited to those set forth herein. The above and other aspects and features of the present disclosure will become more apparent to one of ordinary skill in the art to which the present disclosure pertains by referencing the detailed description of the present disclosure given below.

According to an embodiment of the present disclosure, a display device includes a substrate, a first transistor on the substrate, first and second electrodes on the first transistor and extending in one direction and spaced apart from each other, a light emitting element on the first electrode and the second electrode, and a first connection electrode in contact with one end of the light emitting element and a second connection electrode in contact with another end of the light emitting element. The first electrode and the second electrode are spaced apart from the first transistor, and the first connection electrode is connected to the first transistor and the first electrode.

The first electrode may have a first portion overlapping the first connection electrode and a second portion spaced apart from the first portion and not overlapping the first connection electrode.

The display device may further include a first voltage line configured to supply a high potential voltage to the first transistor, a horizontal voltage line crossing the first voltage line and configured to supply a low potential voltage, and a first vertical voltage line crossing the horizontal voltage line and configured to receive the low potential voltage from the horizontal voltage line. The second portion of the first electrode may be connected to the horizontal voltage line.

The first portion and the second portion of the first electrode may overlap the first vertical voltage line.

The first connection electrode and the second connection electrode may overlap the first vertical voltage line.

The first portion of the first electrode may be connected to the first connection electrode to form an equipotential.

The first portion and the second portion of the first electrode may be formed in an island shape, and the second electrode may be a floating electrode.

The first connection electrode may have a first horizontal portion extending from the second electrode to the first electrode, a first vertical portion extending in a crossing direction from the first horizontal portion, a second horizontal portion extending parallel to the first horizontal portion from the first vertical portion, and a second vertical portion extending parallel to the first vertical portion from the second horizontal portion.

The first horizontal portion may connect the first transistor and the first electrode, and the second vertical portion may be in contact with one end of the light emitting element.

The first horizontal portion and the second vertical portion may overlap the first electrode.

According to another embodiment of the present disclosure, a display device includes a substrate, a horizontal voltage line on the substrate and extending in a first direction, a first vertical voltage line extending in a second direction crossing the first direction and connected to the horizontal voltage line, first and second electrodes extending in the second direction and spaced apart from each other on the horizontal voltage line and the first vertical voltage line, and a first connection electrode and a second connection electrode on the first electrode and the second electrode and overlapping the second electrode. The first connection electrode has a first horizontal portion extending in the first direction, a first vertical portion extending in the second direction from the first horizontal portion, a second horizontal portion extending parallel to the first horizontal portion from the first vertical portion, and a second vertical portion extending parallel to the first vertical portion from the second horizontal portion, and the first horizontal portion and the second vertical portion overlap the first electrode and the first vertical voltage line.

The display device may further include a first transistor configured to supply a driving current to the first connection electrode. One end of the first horizontal portion may be connected to the first transistor, and another end of the first horizontal portion may be connected to the first electrode.

The display device may further include a plurality of light emitting elements aligned between the first electrode and the second electrode. The first transistor may be configured to supply the driving current to the plurality of light emitting elements through the first connection electrode.

The display device may further include a gate line extending in the first direction, a first data line extending in the second direction and crossing the gate line, a second transistor at where the gate line and the first data line cross each other, and a first capacitor between the first transistor and the second transistor.

The first vertical portion may overlap the first capacitor and the first transistor, and the second horizontal portion may overlap the second transistor and the first data line.

The display device may further include a third connection electrode facing the second connection electrode, a fourth connection electrode facing the third connection electrode, and a fifth connection electrode facing the fourth connection electrode. The third connection electrode and the fourth connection electrode may overlap the second electrode.

The display device may further include a first light emitting element connected to the first connection electrode and the second connection electrode, a second light emitting element connected to the second connection electrode and the third connection electrode, a third light emitting element connected to the third connection electrode and the fourth connection electrode, and a fourth light emitting element connected to the fourth connection electrode and the fifth connection electrode.

The fifth connection electrode may be connected to the horizontal voltage line.

The first electrode may have a first portion overlapping the first connection electrode and a second portion spaced apart from the first portion and not overlapping the first connection electrode, and the second portion may connect the horizontal voltage line and the first vertical voltage line.

The first portion of the first electrode may be connected to the first connection electrode to form an equipotential, and the second electrode may be a floating electrode.

According to embodiments of the display device, by connecting the first electrode and the first connection electrode so that the same driving current is applied from the first transistor, even if any one of the first electrode and the connection electrodes is short-circuited, the driving current is applied to the short-circuited connection electrode from the first electrode and some light emitting elements may normally emit light. Therefore, a dark spot or bright spot defect may not occur in one sub-pixel due to a short circuit of the electrodes.

However, aspects and features of embodiments of the present disclosure are not limited to those set forth herein. The above and other aspects and features of the present disclosure will become more apparent to one of ordinary skill in the art to which the embodiments pertain by referencing the claims, detailed description, and drawings provided herein.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION

Figure 1:
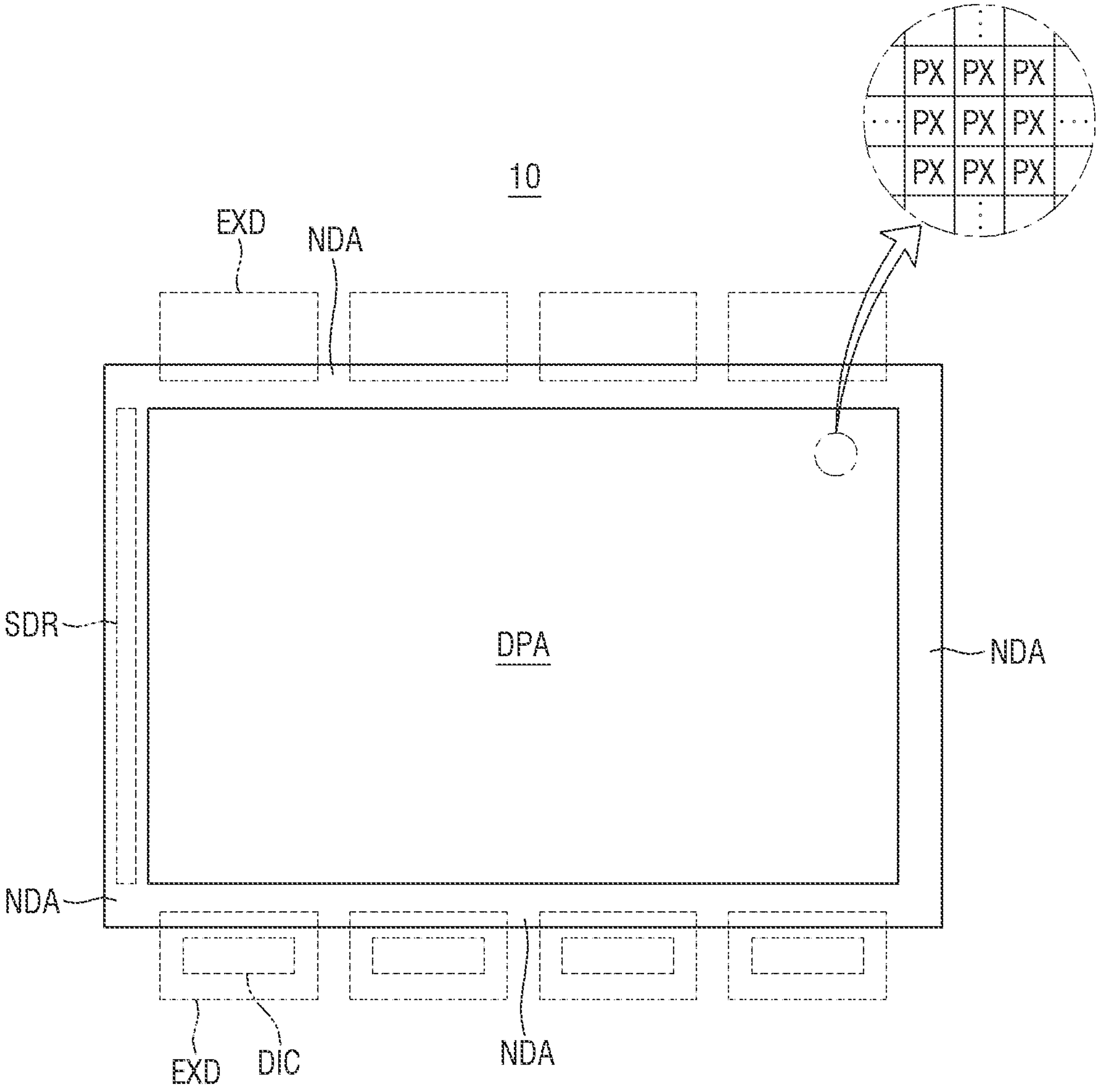
FIG. 1 is a schematic plan view of a display device according to an embodiment.

The present disclosure will now be described more fully hereinafter with reference to the accompanying drawings, in which embodiments of the present disclosure are shown. The present disclosure may, however, be embodied in different forms and should not be construed as limited to the embodiments set forth herein. Rather, these embodiments are provided so that this disclosure will be thorough and complete, and will filly convey the scope of the present disclosure to those skilled in the art.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

In the figures, dimensions of the various elements, layers, etc. may be exaggerated for clarity of illustration. The same reference numerals designate the same elements. As used herein, the term "and/or" includes any and all combinations of one or more of the associated listed items. Further, the use of "may" when describing embodiments of the present disclosure relates to "one or more embodiments of the present disclosure." Expressions, such as "at least one of," when preceding a list of elements, modify the entire list of elements and do not modify the individual elements of the list. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing embodiments of the present disclosure and is not intended to be limiting of the present disclosure. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

Each of the features of the various embodiments of the present disclosure may be combined or combined with each other, in part or in whole, and technically various interlocking and driving are possible. Each embodiment may be implemented independently of each other or may be implemented together in an association.

Hereinafter, embodiments of the present disclosure will be described with reference to the accompanying drawings.

FIG. 1 is a schematic plan view of a display device according to an embodiment.

Referring to FIG. 1, a display device 10 is configured to display a moving image and/or a still image. The display device 10 may refer to (or may represent) any electronic device that provides a display screen. For example, the display device 10 may include televisions, laptop computers, monitors, billboards, Internet of Things (IoT) devices, mobile phones, smartphones, tablet personal computers (PCs), electronic watches, smartwatches, watch phones, head mounted displays, mobile communication terminals, electronic notebooks, electronic books, portable multimedia players (PMPs), navigation, game consoles, digital cameras, camcorders, and the like that provide (or include) the display screen.

The display device 10 includes a display panel providing (or having) a display screen. Examples of the display panel may include an inorganic light emitting diode display panel, an organic light emitting display panel, a quantum dot light emitting display panel, a plasma display panel, and a field emission display panel. Hereinafter, an inorganic light emitting diode display panel is illustrated as an example of the display panel, but the present disclosure is not limited thereto. Any display panel may also be used as long as the same technical idea is applicable.

A shape of the display device 10 may be variously changed. For example, the display device 10 may have a shape such as a rectangle with a long width, a rectangle with a long length, a square, a quadrangle with rounded corners (or vertices), other polygons, or a circle. A shape of a display area DPA of the display device 10 may also be similar to an overall shape of the display device 10. In FIG. 1, the display device 10 and the display area DPA has a rectangular shape with a long width as an example.

The display device 10 may have the display area DPA and a non-display area NDA. The display area DPA is an area in which an image may be displayed, and the non-display area NDA is an area in which an image is not displayed. The display area DPA may be referred to as an active area, and the non-display area NDA may be referred to as a non-active area. The display area DPA may generally occupy the center of the display device 10.

The display area DPA may include a plurality of pixels PX. The plurality of pixels PX may be arranged in a matrix. A shape of each pixel PX may be a rectangular shape or a square shape in a plan view but is not limited thereto and may be a rhombic shape of which each side is inclined with respect to one direction. The respective pixels PX may be alternately arranged in a stripe type or a PENTILE® (a registered trademark of Samsung Display Co., Ltd.) type. In addition, each of the pixels PX may include one or more light emitting elements ED for emitting light of a specific wavelength band to display a specific color.

The non-display area NDA may be disposed around the display area DPA. The non-display area NDA may entirely or partially surround (e.g., surround in a plan view or extend around a periphery of) the display area DPA. The display area DPA may have a rectangular shape, and the non-display area NDA may be disposed adjacent to four sides of the display area DPA. The non-display area NDA may constitute a bezel of the display device 10.

A driving circuit or a driving element for driving the display area DPA may be disposed in the non-display area NDA. In an embodiment, pad portions may be provided on a display substrate of the display device 10 in the non-display area NDA disposed adjacent to a first long side (e.g., the lower side in FIG. 1) of the display device 10 and a non-display area NDA disposed adjacent to a second long side (e.g., the upper side in FIG. 1) of the display device 10, and external devices EXD may be mounted on pad electrodes of the pad portions. Examples of the external devices EXD may include a connection film, a printed circuit board, a driving chip (DIC), a connector, a line connection film, and the like. A scan driver SDR and the like formed directly on the display substrate of the display device 10 may be disposed in the non-display area NDA disposed adjacent to a first short side (e.g., the left side in FIG. 1) of the display device 10.

Figure 2:
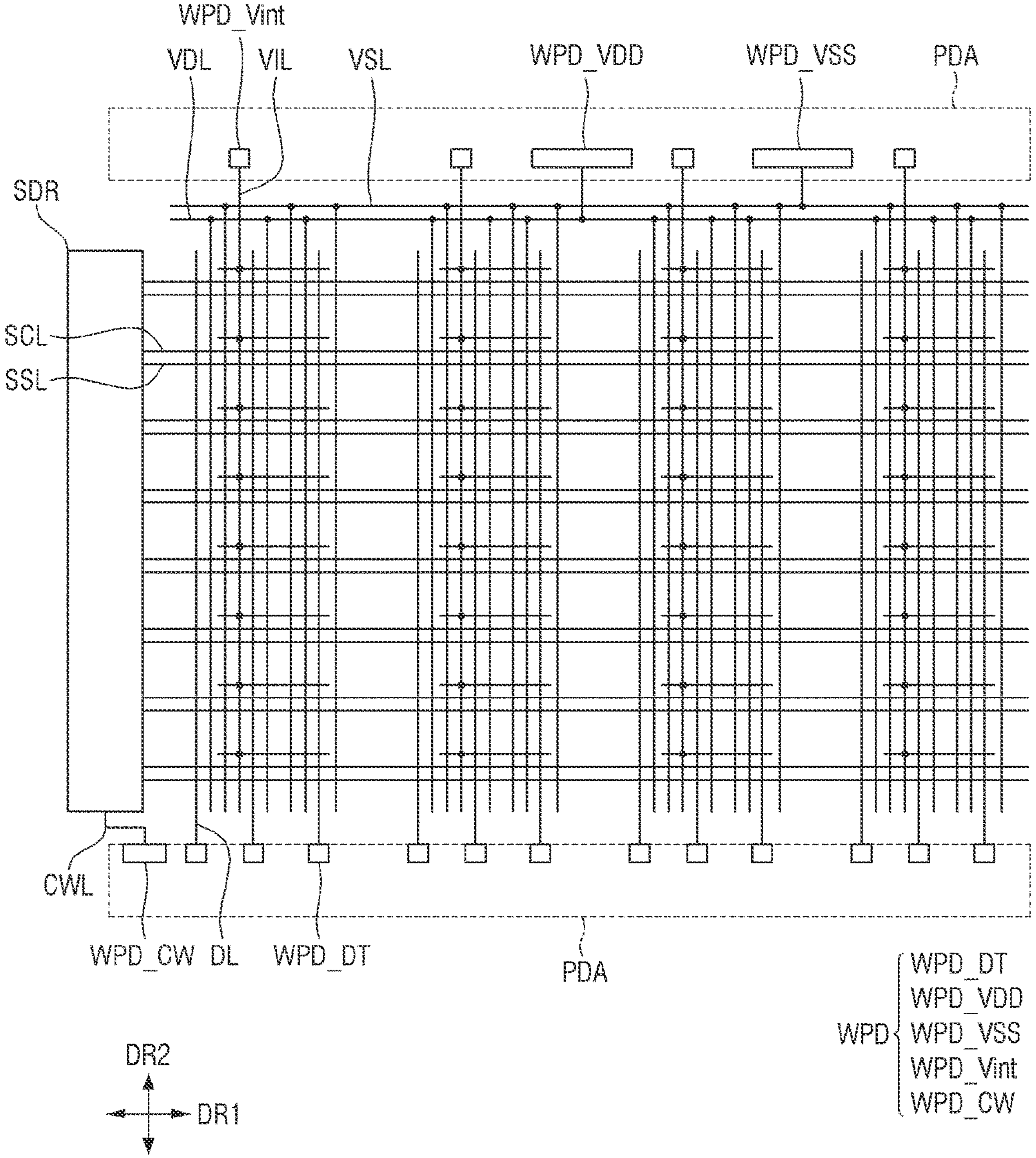
FIG. 2 is a schematic layout view illustrating lines included in the display device according to an embodiment.

FIG. 2 is a schematic layout view illustrating lines included in the display device according to an embodiment.

Referring to FIG. 2, the display device 10 may include a plurality of lines. The plurality of lines may include a gate line SCL, a sensing line SSL, a data line DL, an initialization voltage line VIL, a first voltage line VDL, and a second voltage line VSL. In addition, other lines may be disposed in the display device 10.

The gate line SCL and the sensing line SSL may extend in a first direction DR1. The gate line SCL and the sensing line SSL may be connected to the scan driver SDR. The scan driver SDR may include a driving circuit. The scan driver SDR may be disposed on one side of the display area DPA in the first direction DR1 but is not limited thereto. The scan driver SDR may be connected to a signal connection line CWL, and at least one end of the signal connection line CWL may be connected to an external device by forming a pad WPD_CW on the non-display area NDA.

In the present specification, the meaning of 'connection' may mean that any one member is connected to another member through mutual physical contact, as well as that any one member is connected to another member through the other member. In addition, it may be understood that any one portion and another portion as one integrated member are interconnected due to the integrated member. Furthermore, a connection between any one member and another member may be interpreted as including an electrical connection through the other member in addition to a connection by direct contact therebetween.

The data line DTL and the initialization voltage line VIL may extend in a second direction DR2 intersecting the first direction DR1. The initialization voltage line VIL may further include a portion extending in the second direction DR2 and a portion branching therefrom in the first direction DR1. The first voltage line VDL and the second voltage line VSL may also include portions extending in the second direction DR2 and portions connected thereto and extending in the first direction DR1. The first voltage line VDL and the second voltage line VSL may have a mesh structure but are not limited thereto. Each of the pixels PX of the display device 10 may be connected to one or more data lines DTL, initialization voltage lines VIL, first voltage lines VDL, and second voltage lines VSL.

The data line DTL, the initialization voltage line VIL, the first voltage line VDL, and the second voltage line VSL may be electrically connected to at least one line pad WPD. Each line pad WPD may be disposed in the non-display area NDA. In an embodiment, a line pad WPD_DT (hereinafter, referred to as 'data pad') of the data line DTL may be disposed in a pad area PDA on one side of the display area DPA in the second direction DR2, and a line pad WPD_Vint (hereinafter, 'initialization voltage pad') of the initialization voltage line VIL, a line pad WPD_VDD of the first voltage line VDL (hereinafter, a 'first power pad'), and a line pad WPD_VSS (hereinafter, 'second power pad') of the second voltage line VSL may be disposed in a pad area PDA positioned on the other side of the display area DPA in the second direction DR2. As another example, the data pad WPD_DT, the initialization voltage pad WPD_Vint, the first power pad WPD_VDD, and the second power pad WPD_VSS may all be disposed in the same area, for example, in the non-display area NDA positioned on an upper side of the display area DPA. The external device EXD may be mounted on the line pad WPD. The external device EXD may be mounted on the line pad WPD through an anisotropic conductive film, ultrasonic bonding, or the like.

Each pixel PX or sub-pixel SPXn (n being an integer of 1 to 3) of the display device 10 includes a pixel driving circuit. The above-described lines may apply driving signal to each pixel driving circuit while passing through each pixel PX or passing around each pixel PX. The pixel driving circuit may include a transistor and a capacitor. The numbers of transistors and capacitors in each pixel driving circuit may be variously changed. According to an embodiment, each sub-pixel SPXn of the display device 10 may have a 3T1C structure in which the pixel driving circuit includes three transistors and one capacitor. Hereinafter, the pixel driving circuit will be described using the 3T1C structure as an example, but the present disclosure is not limited thereto and various other modified pixel PX structures, such as a 2T1C structure, a 7T1C structure, and a 6T1C structure, may be applied.

Figure 3:
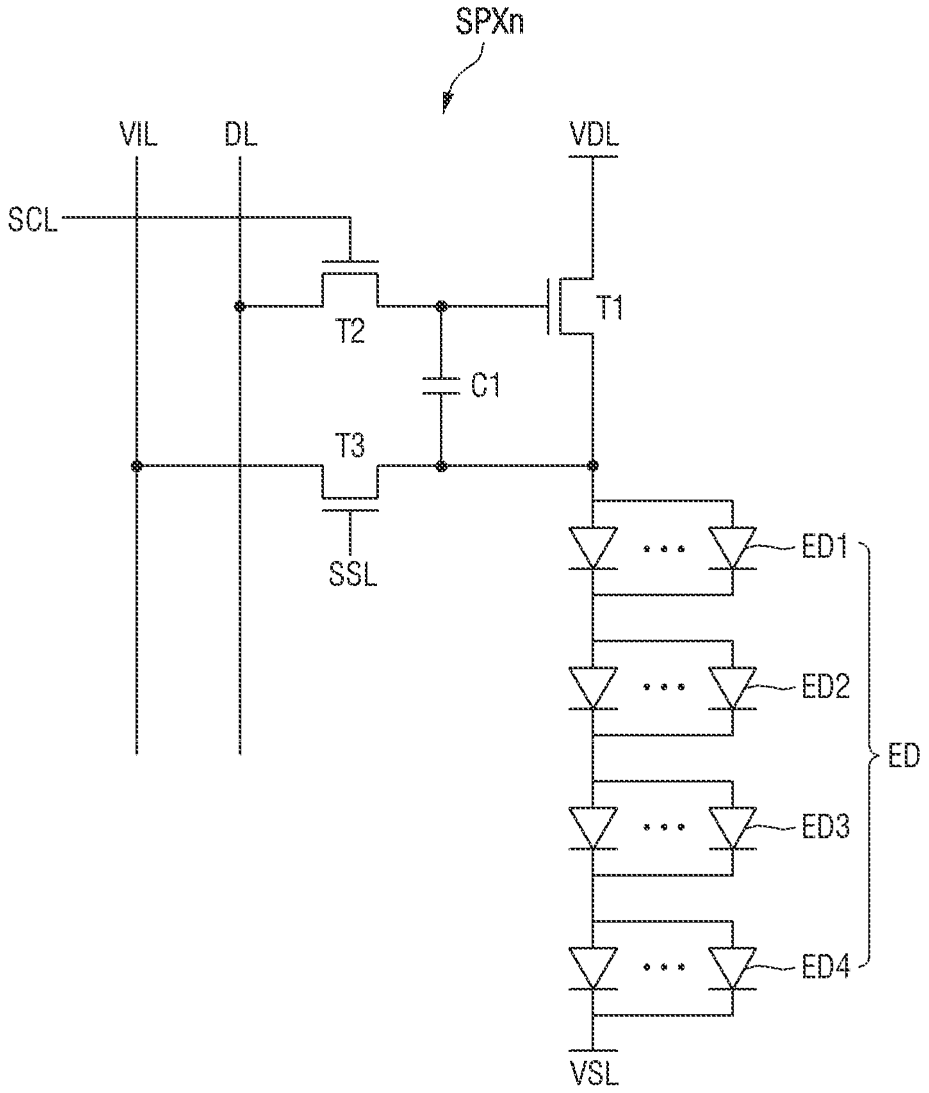
FIG. 3 is an equivalent circuit diagram of a sub-pixel of the display device according to an embodiment.

FIG. 3 is an equivalent circuit diagram of a sub-pixel of the display device according to an embodiment.

Referring to FIG. 3, each of the sub-pixels SPXn may be connected to the first voltage line VDL, the data line DL, the initialization voltage line VIL, the gate line SCL, the sensing line SSL, and the second voltage line VSL. Each of the sub-pixels SPXn may include first to third transistors T1, T2, and T3, a first capacitor C1, and a plurality of light emitting elements ED.

The light emitting element ED is configured to emit light according to a current supplied through the first transistor T1. The light emitting element ED may be disposed between a first electrode and a second electrode. The light emitting element ED may emit light of a specific wavelength band by electrical signals transferred from the first electrode and the second electrode.

The light emitting element ED may include first to fourth light emitting elements ED1, ED2, ED3, and ED4. The first to fourth light emitting elements ED1, ED2, ED3, and ED4 may be connected in series. A plurality of first light emitting elements ED1 may be connected in parallel. A plurality of second light emitting elements ED2 may be connected in parallel. A plurality of third light emitting elements ED3 may be connected in parallel. A plurality of fourth light emitting elements ED4 may be connected in parallel. The first to fourth light emitting elements ED1, ED2, ED3, and ED4 may receive a driving current to emit light. The amount of light emission or luminance of the light emitting element ED may be proportional to the magnitude of the driving current. The light emitting element ED may be an inorganic light emitting element including an inorganic semiconductor but is not limited thereto.

One end of the light emitting element ED may be connected to a source electrode of the first transistor T1, and the other end of the light emitting element ED may be connected to the second voltage line VSL to which a low potential voltage (hereinafter, referred to as a second power voltage) lower than a high potential voltage (hereinafter, referred to as a first power voltage) of the first voltage line VDL is supplied.

The first transistor T1 adjusts a current flowing from the first voltage line VDL to which the first power voltage is supplied to the light emitting element ED according to a voltage difference between a gate electrode and the source electrode thereof. As an example, the first transistor T1 may be a driving transistor for driving the light emitting element ED. The gate electrode of the first transistor T1 may be connected to a source electrode of a third transistor T3, the source electrode of the first transistor T1 may be connected to the first electrode of the light emitting element ED, and a drain electrode of the first transistor T1 may be connected to the first voltage line VDL to which the first power voltage is applied.

The second transistor T2 is turned on by a scan signal of the gate line SCL to connect the data line DTL to the gate electrode of the first transistor T1. A gate electrode of the second transistor T2 may be connected to the gate line SCL, a source electrode of the second transistor T2 may be connected to the gate electrode of the first transistor T1, and a drain electrode of the second transistor T2 may be connected to the data line DTL.

The third transistor T3 is turned on by a sensing signal of the sensing line SSL to connect the initialization voltage line VIL to one end of the light emitting element ED. A gate electrode of the third transistor T3 is connected to the sensing line SSL, a drain electrode of the third transistor T3 may be connected to the initialization voltage line VIL, and the source electrode of the third transistor T3 may be connected to one end of the light emitting element ED or the source electrode of the first transistor T1.

In an embodiment, the source electrode and drain electrode of the first to third transistors T1, T2, and T3 are not limited to the above description and vice versa.

A storage capacitor C1 is formed between the gate electrode and the source electrode of the first transistor T1. The storage capacitor C1 stores a voltage difference between a gate voltage and a source voltage of the first transistor T1.

Each of the first to third transistors T1, T2, and T3 may be formed as a thin film transistor. In addition, although it is primarily described in FIG. 3 that each of the first to third transistors T1, T2, and T3 is formed as an N-type metal oxide semiconductor field effect transistor (MOSFET), the present disclosure is not limited thereto. For example, each of the first to third transistors T1, T2, and T3 may be formed as a P-type MOSFET, or some of the first to third transistors T1, T2, and T3 may be formed as an N-type MOSFET and the others of the first to third transistors T1, T2, and T3 may be formed as a P-type MOSFET.

Figure 4:
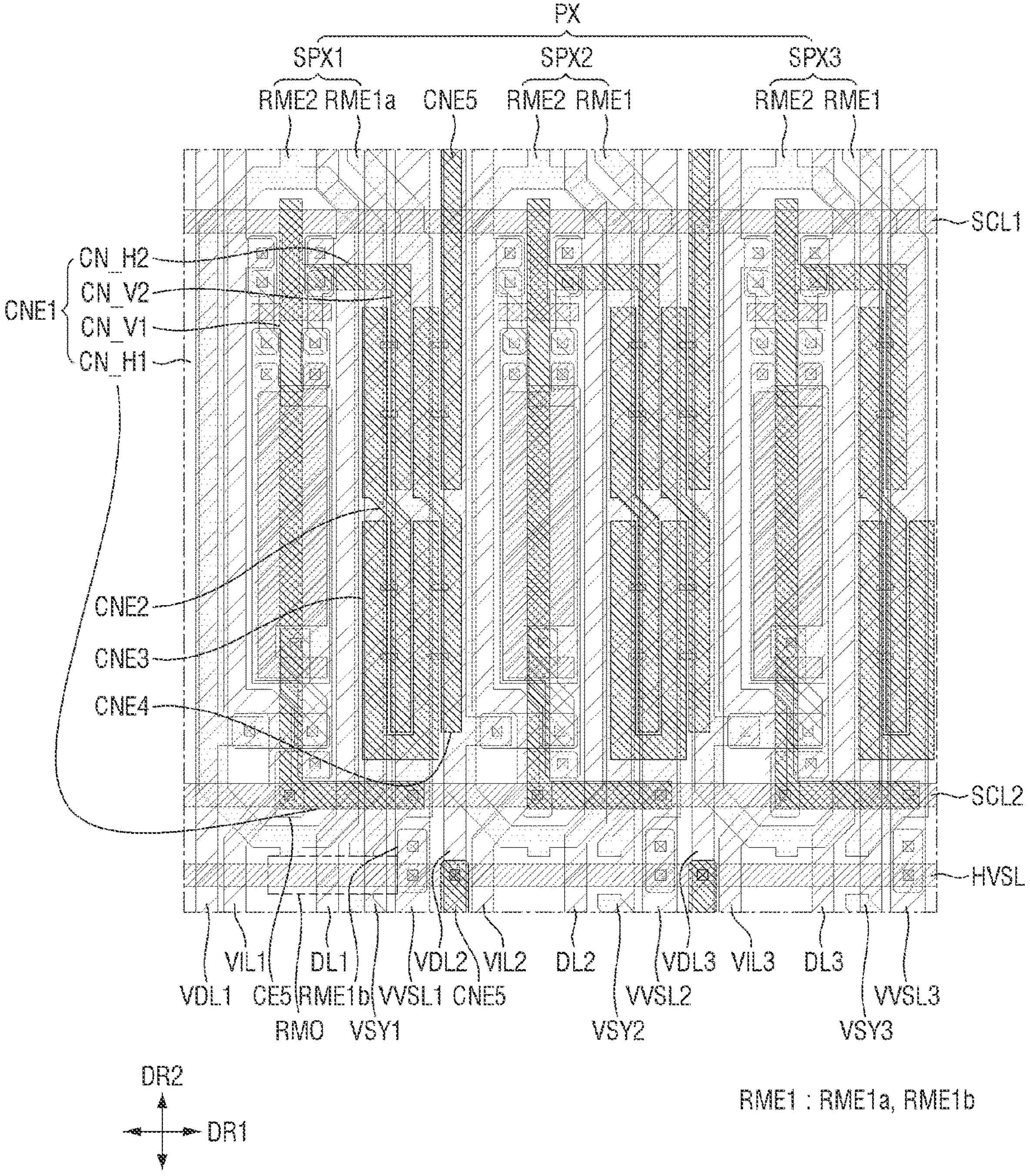
FIG. 4 is a plan view illustrating one pixel of the display device according to an embodiment.
Figure 5:
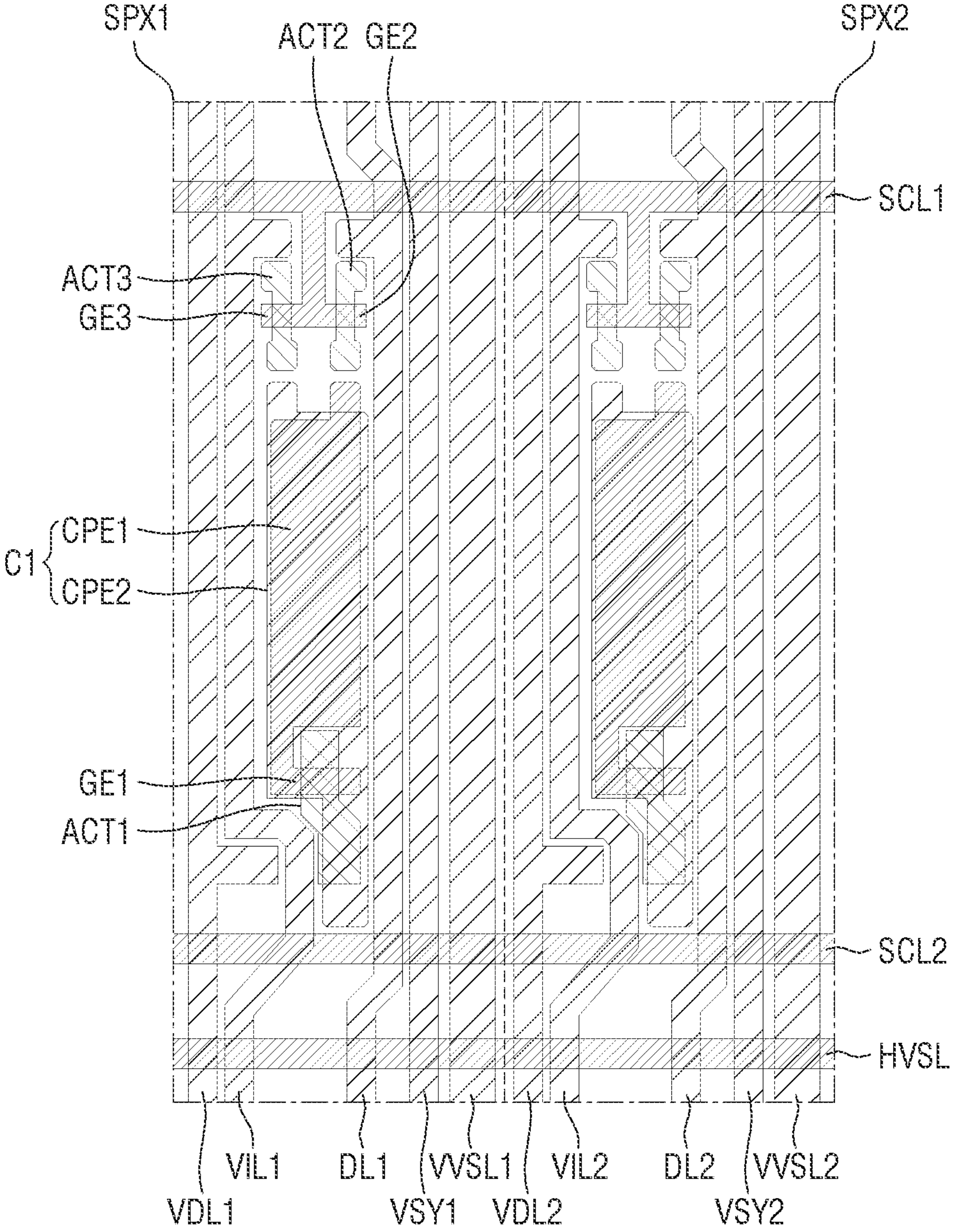
FIG. 5 is a plan view illustrating a first conductive layer, an active layer, and a second conductive layer in the display device shown in FIG. 4.
Figure 6:
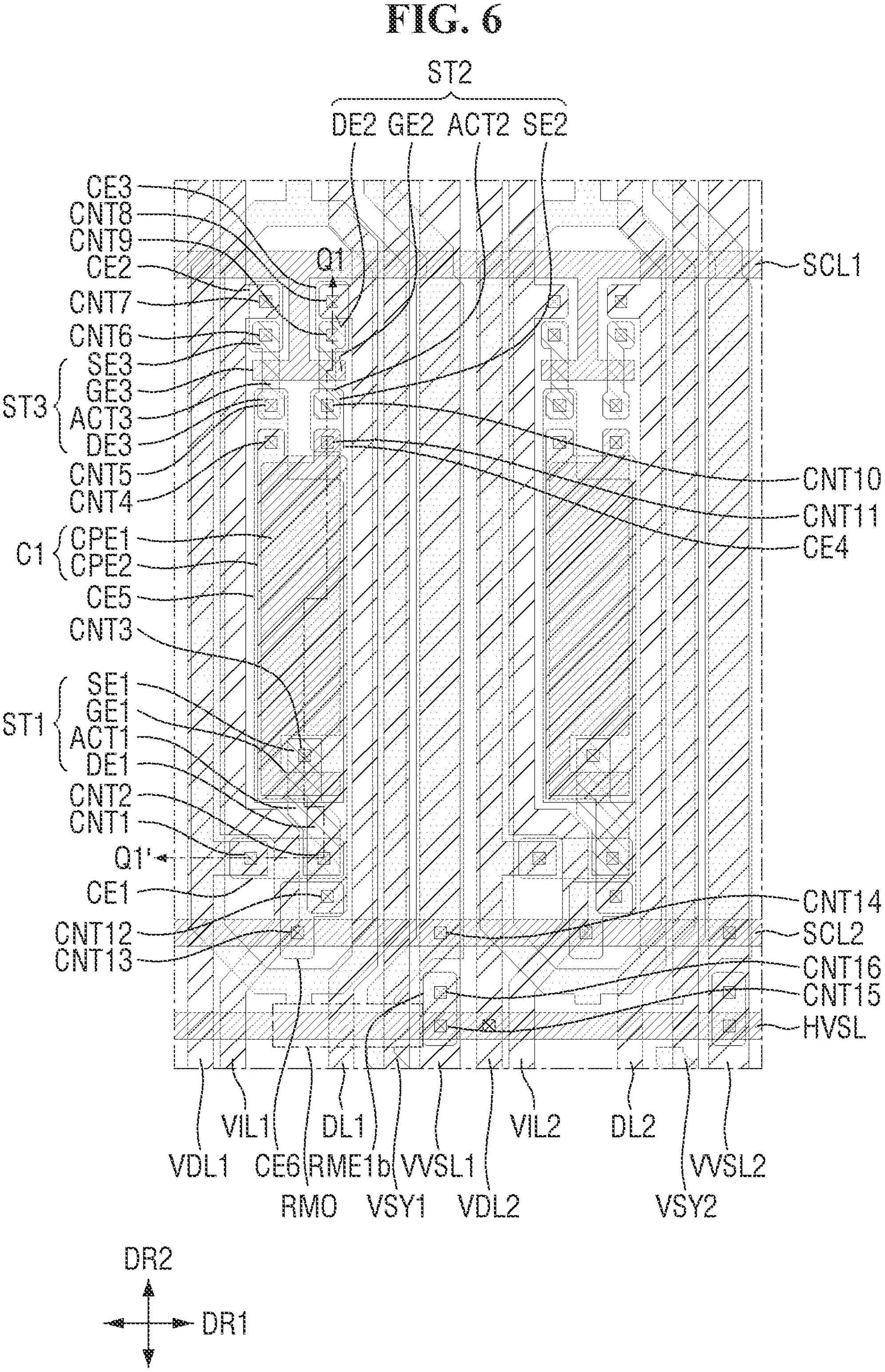
FIG. 6 is a plan view illustrating a first conductive layer, an active layer, a second conductive layer, and a third conductive layer in the display device shown in FIG. 4.
Figure 7:
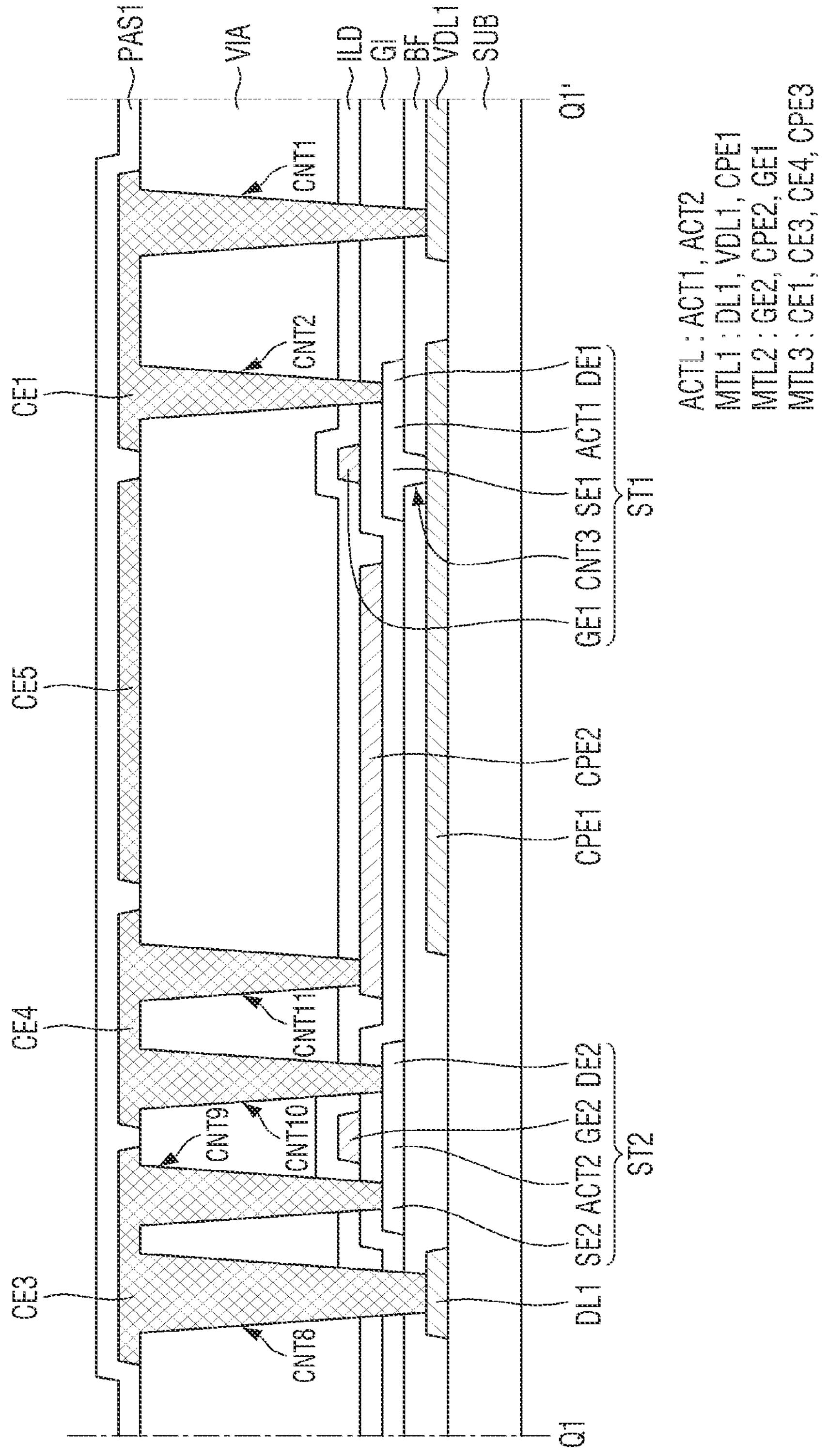
FIG. 7 is a cross-sectional view taken along the line Q1-Q1' of FIG. 6.

FIG. 4 is a plan view illustrating one pixel of the display device according to an embodiment. FIG. 5 is a plan view illustrating a first conductive layer, an active layer, and a second conductive layer in the display device shown in FIG. 4. FIG. 6 is a plan view illustrating a first conductive layer, an active layer, a second conductive layer, and a third conductive layer in the display device shown in FIG. 4. FIG. 7 is a cross-sectional view taken along the line Q1-Q1' of FIG. 6.

Referring to FIGS. 4 to 7, the display area DA may include a pixel PX including a plurality of sub-pixels SPX1, SPX2, and SPX3. The plurality of sub-pixels SPX1, SPX2, and SPX3 may include a first sub-pixel SPX1, a second sub-pixel SPX2, and a third sub-pixel SPX3. In an embodiment, the first sub-pixel SPX1 may be disposed on the left side of the drawing, the second sub-pixel SPX2 may be disposed at the center of the drawing, and the third sub-pixel SPX3 may be disposed on the right side of the drawing. However, the present disclosure is not limited thereto, and the plurality of sub-pixels may include four sub-pixels or may include more than four sub-pixels.

The pixel PX may include first to third voltage lines VDL1, VDL2, and VDL3, first to third data lines DL1, DL2, and DL3, first to third initialization voltage lines VIL1, VIL2, and VIL3, first to third sink lines VSY1, VSY2, and VSY3, first and second gate lines SCL1 and SCL2, first horizontal voltage line HVSL, and first to third vertical voltage lines VVSL1, VVSL2, and VVSL3.

The first to third voltage lines VDL1, VDL2, and VDL3 may be included in the first conductive layer MTL1. The first conductive layer MTL1 may be directly disposed on a substrate SUB. The first to third voltage lines VDL1, VDL2, and VDL3 may be disposed on the left side of each (of each respective) sub-pixel SPXn. For example, the first voltage line VDL1 may be disposed on the left side of the first sub-pixel SPX1, the second voltage line VDL2 may be disposed between the first sub-pixel SPX1 and the second sub-pixel SPX2, and the third voltage line VDL3 may be disposed between the second sub-pixel SPX2 and the third sub-pixel SPX3.

Each of the voltage lines VDL1, VDL2, and VDL3 may be connected to the first transistor ST1 through a first connection electrode of each sub-pixel SPXn. For example, the first voltage line VDL1 may be connected to a first connection electrode CE1 of the first sub-pixel SPX1 through a first contact hole (e.g., a first contact opening) CNT1. The first connection electrode CE1 may be connected to a first drain electrode DE1 of the first transistor ST1 through a second contact hole (e.g., a second contact opening) CNT2. Therefore, the first to third voltage lines VDL1, VDL2, and VDL3 may supply a driving voltage that is a high potential voltage to the first to third sub-pixels SPX1, SPX2, and SPX3.

The first to third initialization voltage lines VIL1, VIL2, and VIL3 may be included in the first conductive layer MTL1. The first to third initialization voltage lines VIL1, VIL2, and VIL3 may be disposed on the right side of the first to third voltage lines VDL1, VDL2, and VDL3, respectively, in each sub-pixel SPXn. The first to third initialization voltage lines VIL1, VIL2, and VIL3 may be connected to the third transistor ST3 in each sub-pixel SPXn. For example, the first initialization voltage line VIL1 may be connected to a second connection electrode CE2 of the first sub-pixel SPX1 through a seventh contact hole (e.g., a seventh contact opening) CNT7. The second connection electrode CE2 may be connected to a third source electrode SE3 of the third transistor ST3 through a sixth contact hole (e.g., a sixth contact opening) CNT6. Therefore, the first to third initialization voltage lines VIL1, VIL2, and VIL3 may supply an initialization voltage to the third transistor ST3 of each of the first to third sub-pixels SPX1, SPX2, and SPX3 and may receive a sensing signal from the third transistor ST3.

The first to third data lines DL1, DL2, and DL3 may be included in the first conductive layer MTL1. The first to third data lines DL1, DL2, and DL3 may be disposed on the right side of the sub-pixel SPXn, respectively. For example, the first data line DL1 may be disposed between the first sub-pixel SPX1 and the second sub-pixel SPX2, the second data line DL2 may be disposed between the second sub-pixel SPX2 and the third sub-pixel SPX3, and the third data line DL3 may be disposed on the right side of the third sub-pixel SPX3. Each of the data lines DL1, DL2, and DL3 may be connected to the second transistor ST2 in each sub-pixel SPXn. For example, the first data line DL1 may be connected to a third connection electrode CE3 through an eighth contact hole (e.g., an eighth contact opening) CNT8 in the first sub-pixel SPX1. The third connection electrode CE3 may be connected to a second source electrode SE2 of the second transistor ST2 through a ninth contact hole (e.g., a ninth contact opening) CNT9. Therefore, each of the data lines DL1, DL2, and DL3 may supply a data voltage to the second transistor ST2 in each sub-pixel SPXn.

The first to third sync lines VSY1, VSY2, and VSY3 may be included in the first conductive layer MTL1. The first to third sync lines VSY1, VSY2, and VSY3 may be disposed on the right side of each of the data lines DL1, DL2, and DL3 of each sub-pixel SPXn, respectively. For example, the first sync line VSY1 may be disposed between the first data line DL1 and the second sub-pixel SPX2, the second sync line VSY2 may be disposed between the second data line DL2 and the third sub-pixel SPX3, and the third sync line VSY3 may be disposed on the right side of the third data line DL3. A signal for synchronizing may be applied to each of the sync lines VSY1, VSY2, and VSY3 when an alignment signal of a second electrode RME2 overlapping each of the sync lines VSY1, VSY2, and VSY3 in a thickness direction is applied. Each of the sync lines VSY1, VSY2, and VSY3 is not connected to any line in each sub-pixel SPXn and may be disposed to overlap the second electrode RME2.

The first and second gate lines SCL1 and SCL2 may be included in a second conductive layer MTL2. The second conductive layer MTL2 may be disposed on a gate insulating layer GI covering an active region ACT1 of each of the transistors ST1, ST2, and ST3. The first gate line SCL1 may be disposed on an upper side (in the drawings) in each sub-pixel SPXn, and the second gate line SCL2 may be disposed on a lower side (in the drawings) in each sub-pixel SPXn. The first gate line SCL1 may extend and branch to the second transistor ST2 and the third transistor ST3 of each sub-pixel SPXn to act as gate electrodes GE2 and GE3 thereof. Therefore, the first gate line SCL1 may supply a gate signal to each sub-pixel SPXn. The second gate line SCL2 may supply a gate signal to each sub-pixel SPXn of a pixel PX adjacent to the pixel PX illustrated in the drawing. The first gate line SCL1 and the second gate line SCL2 may alternately supply the gate signal in units of pixels.

The horizontal voltage line HVSL may be disposed in the second conductive layer MTL2. The horizontal voltage line HVSL may be disposed at the lowermost side (in the drawings) of each sub-pixel SPXn. The horizontal voltage line HVSL may be connected to a second portion RME1*b* of a first electrode RME1, to be described later, through a fifteenth contact hole (e.g., a fifteenth contact opening) CNT15. The second portion RME1*b* of the first electrode RME1 may be connected to the first vertical voltage line VVSL1 through a sixteenth contact hole (e.g., a sixteenth contact opening) CNT16. The horizontal voltage line HVSL may supply a low potential voltage to each of the vertical voltage lines VVSL1, VVSL2, and VVSL3 of each sub-pixel SPXn.

The first to third vertical voltage lines VVSL1, VVSL2, and VVSL3 may be included in the first conductive layer MTL1. Each of the vertical voltage lines VVSL1, VVSL2, and VVSL3 may be disposed on the right side of each sub-pixel SPXn and may cross (e.g., may intersect) the horizontal voltage line HVSL. For example, the first vertical voltage line VVSL1 may be disposed between the first sub-pixel SPX1 and the second sub-pixel SPX2, the second vertical voltage line VVSL2 may be disposed between the second sub-pixel SPX2 and the third sub-pixel SPX3, and the third vertical voltage line VVSL3 may be disposed on the right side of the third sub-pixel SPX3. Each of the vertical voltage lines VVSL1, VVSL2, and VVSL3 may supply a low potential voltage to the first electrode RME1 of each sub-pixel SPXn. For example, the first vertical voltage line VVSL1 may be connected to the first electrode RME1 through the fifteenth contact hole CNT15 to supply a low potential voltage thereto.

Each sub-pixel SPXn may include a pixel circuit. Hereinafter, the first sub-pixel SPX1 will be described as an example. The pixel circuit of the first sub-pixel SPX1 may include first to third transistors ST1, ST2, and ST3, and a first capacitor C1.

The first transistor ST1 may include a first active region ACT1, a first gate electrode GE1, a first drain electrode DE1, and a first source electrode SE1. The first active region ACT1 of the first transistor ST1 may be included in an active layer ACTL and may overlap the first gate electrode GE1 of the first transistor ST1 in the thickness direction (e.g., the Z-axis direction). The active layer ACTL may be disposed on a buffer layer BF covering the first conductive layer MTL1.

The first gate electrode GE1 of the first transistor ST1 may be included in the second conductive layer MTL2. The first gate electrode GE1 of the first transistor ST1 may be a portion of a second capacitor electrode CPE2 of the first capacitor C1. The second capacitor electrode CPE2 may be connected to a fourth connection electrode CE4 of a third conductive layer MTL3 through an eleventh contact hole (e.g., an eleventh contact opening) CNT11. The fourth connection electrode CE4 may be connected to the second source electrode SE2 of the second transistor ST2 of the active layer ACTL through a tenth contact hole (e.g., a tenth contact opening) CNT10. The third conductive layer MTL3 may be disposed on a via layer VIA, and the via layer VIA may be disposed on an interlayer insulating layer ILD disposed on the second conductive layer MTL2.

The first drain electrode DE1 and the first source electrode SE1 of the first transistor ST1 may become conductive by heat-treating the active layer ACTL. The first drain electrode DE1 of the first transistor ST1 may be connected to the first connection electrode CE1 of the third conductive layer MTL3 through the second contact hole CNT2. The first connection electrode CE1 may be connected to the first voltage line VDL1 of the first conductive layer MTL1 through the first contact hole CNT1. The first drain electrode DE1 of the first transistor ST1 may receive a driving voltage from the first voltage line VDL1.

The first source electrode SE1 of the first transistor ST1 may be connected to a fifth connection electrode CE5 of the third conductive layer MTL3 through a third contact hole (e.g., a third contact opening) CNT3. The fifth connection electrode CE5 may be connected to the first capacitor electrode CPE1 of the first conductive layer MTL1 through a fourth contact hole (e.g., a fourth contact opening) CNT4. Therefore, the first capacitor C1 may be formed between the first capacitor electrode CPE1 and the second capacitor electrode CPE2.

The second transistor ST2 of the first sub-pixel SPX1 may include a second active region ACT2, a second gate electrode GE2, a second drain electrode DE2, and a second source electrode SE2. The second transistor ST2 may be disposed at where the first gate line SCL1 and the first data line DL1 cross each other (e.g., intersect each other). The second active region ACT2 of the second transistor ST2 may be included in the active layer ACTL and may overlap the second gate electrode GE2 of the second transistor ST2 in the thickness direction.

The second gate electrode GE2 of the second transistor ST2 may be included in the second conductive layer MTL2. The second gate electrode GE2 of the second transistor ST2 may be a portion extending from the first gate line SCL1.

The second drain electrode DE2 and the second source electrode SE2 of the second transistor ST2 may become conductive by heat-treating the active layer ACTL. The second drain electrode DE2 of the second transistor ST2 may be connected to the third connection electrode CE3 of the third conductive layer MTL3 through the ninth contact hole CNT9. The third connection electrode CE3 may be connected to the first data line DL1 through the eighth contact hole CNT8. The second drain electrode DE2 of the second transistor ST2 may receive a data voltage of the first sub-pixel SPX1 from the first data line DL1.

The second source electrode SE2 of the second transistor ST2 may be connected to the fourth connection electrode CE4 of the third conductive layer MTL3 through the tenth contact hole CNT10, and the fourth connection electrode CE4 may be connected to the first capacitor electrode CPE1 through the eleventh contact hole CNT11.

The third transistor ST3 of the first sub-pixel SPX1 may include a third active region ACT3, a third gate electrode GE3, a third drain electrode DE3, and a third source electrode SE3. The third active region ACT3 of the third transistor ST3 may be included in the active layer ACTL and may overlap the third gate electrode GE3 of the third transistor ST3 in the thickness direction.

The third gate electrode GE3 of the third transistor ST3 may be included in the second conductive layer MTL2. The third gate electrode GE3 of the third transistor ST3 may be a portion extending from the first gate line SCL1.

The third drain electrode DE3 and the third source electrode SE3 of the third transistor ST3 may become conductive by heat-treating the active layer ACTL. The third drain electrode DE3 of the third transistor ST3 may be connected to the fifth connection electrode CE5 of the third conductive layer MTL3 through the fifth contact hole CNT5. The fifth connection electrode CE5 may be connected to a sixth connection electrode CE6 of the third conductive layer MTL3 through a twelfth contact hole (e.g., a twelfth contact opening) CNT12, and the sixth connection electrode CE6 may be connected to the first connection electrode CNE1 of the first sub-pixel SPX1 through a thirteenth contact hole (e.g., a thirteenth contact opening) CNT13. In one embodiment, the first connection electrode CNE1 of the first sub-pixel SPX1 may be included in the fourth conductive layer MTL4 on the third conductive layer MTL3.

The third source electrode SE3 of the third transistor ST3 may be connected to the second connection electrode CE2 of the third conductive layer MTL3 through the sixth contact hole CNT6, and the second connection electrode CE2 may be connected to the first initialization voltage line VIL1 through the seventh contact hole CNT7. The third source electrode SE3 of the third transistor ST3 may receive an initialization voltage from the first initialization voltage line VIL1. The third source electrode SE3 of the third transistor ST3 may supply a sensing signal to the first initialization voltage line VIL1.

The first electrode RME1 of each of the first to third sub-pixels SPX1, SPX2, and SPX3 may be included in the third conductive layer MTL3. The first electrode RME1 may include a first portion RME1*a* and a second portion RME1*b*. The first portion RME1*a* of the first electrode RME1 may extend in the second direction DR2, and the first portion RME1*a* and the second portion RME1*b* of the first electrode RME1 may be spaced apart from each other. The first portion RME1*a* and the second portion RME1*b* of the first electrode RME1 may be disposed to overlap the first vertical voltage line VVSL1. The first portion RME1*a* of the first electrode RME1 may overlap the first connection electrode CNE1, and the second portion RME1*b* may not overlap the first connection electrode CNE1.

The first electrode RME1 may be applied with an alignment signal of the light emitting elements ED from the horizontal voltage line HVSL and may be separated into the first portion RME1*a* and the second portion RME1*b* at a separation portion RMO after alignment of the light emitting elements ED is completed. The first portion RME1*a* of the first electrode RME1 may be separated at the separation portion RMO to have an island shape. For example, the first portion RME1*a* of the first electrode RME1 is not connected to the horizontal voltage line HVSL and is not connected to the first transistor ST1 to be spaced apart therefrom. The second portion RME1*b* of the first electrode RME1 may be connected to the horizontal voltage line HVSL through the fifteenth contact hole CNT15 and may be connected to the first vertical voltage line VVSL1 through the sixteenth contact hole CNT16.

The first portion RME1*a* and the second portion RME1*b* of the first electrode RME1 described above may have the same structure in each sub-pixel SPXn. The first electrode RME1 of each of the first to third sub-pixels SPX1, SPX2, and SPX3 may overlap each of the vertical voltage lines VVSL1, VVSL2, and VVSL3 to form an equipotential. For example, the first portion RME1*a* of the first electrode RME1 may overlap the first vertical voltage line VVSL1 to form an equipotential.

The second electrode RME2 of each of the first to third sub-pixels SPX1, SPX2, and SPX3 may be included in the third conductive layer MTL3. The second electrode RME2 may extend in the second direction DR2 and may be disposed between the first electrodes RME1. The second electrode RME2 may have a shape surrounding the pixel circuit of the first sub-pixel SPX1 in a plan view. The second electrode RME2 may have a structure in which it extends in the second direction DR2, bifurcates to surround the pixel circuit in a plan view, and then merges again. The second electrode RME2 may be a floating electrode that is formed in an island shape and is not connected anywhere.

One branched portion of the second electrode RME2 may overlap the first voltage line VDL1, and the other branched portion thereof may overlap the first sink line VSY1. The second electrode RME2 may have the same overlapping structure in each sub-pixel SPXn. The second electrode RME2 of each sub-pixel SPXn may overlap the pixel circuit of each of the first to third pixels SP1, SP2, and SP3, thereby overlapping the first voltage line VDL1 and the first sync line VSY1 to form an equipotential.

The above-described third conductive layer MTL3 may be covered and insulated by a first insulating layer PAS1. A plurality of light emitting elements ED and first to fifth connection electrodes CNE1, CNE2, CNE3, CNE4, and CNE5 may be disposed on the first insulating layer PAS1 of each sub-pixel SPXn. This will be described with reference to other drawings.

Figure 8:
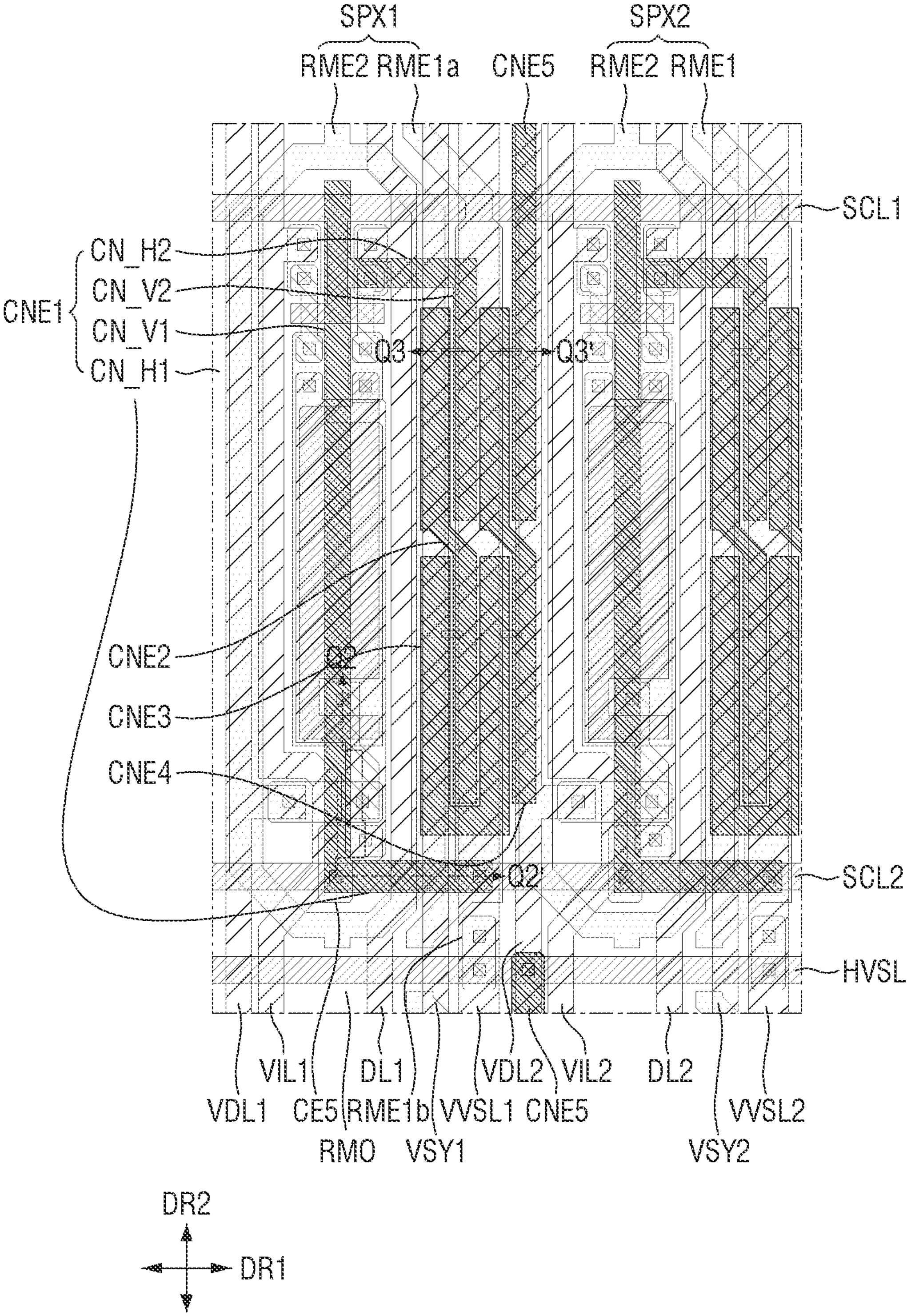
FIG. 8 is a plan view illustrating sub-pixels of the display device according to an embodiment.
Figure 9:
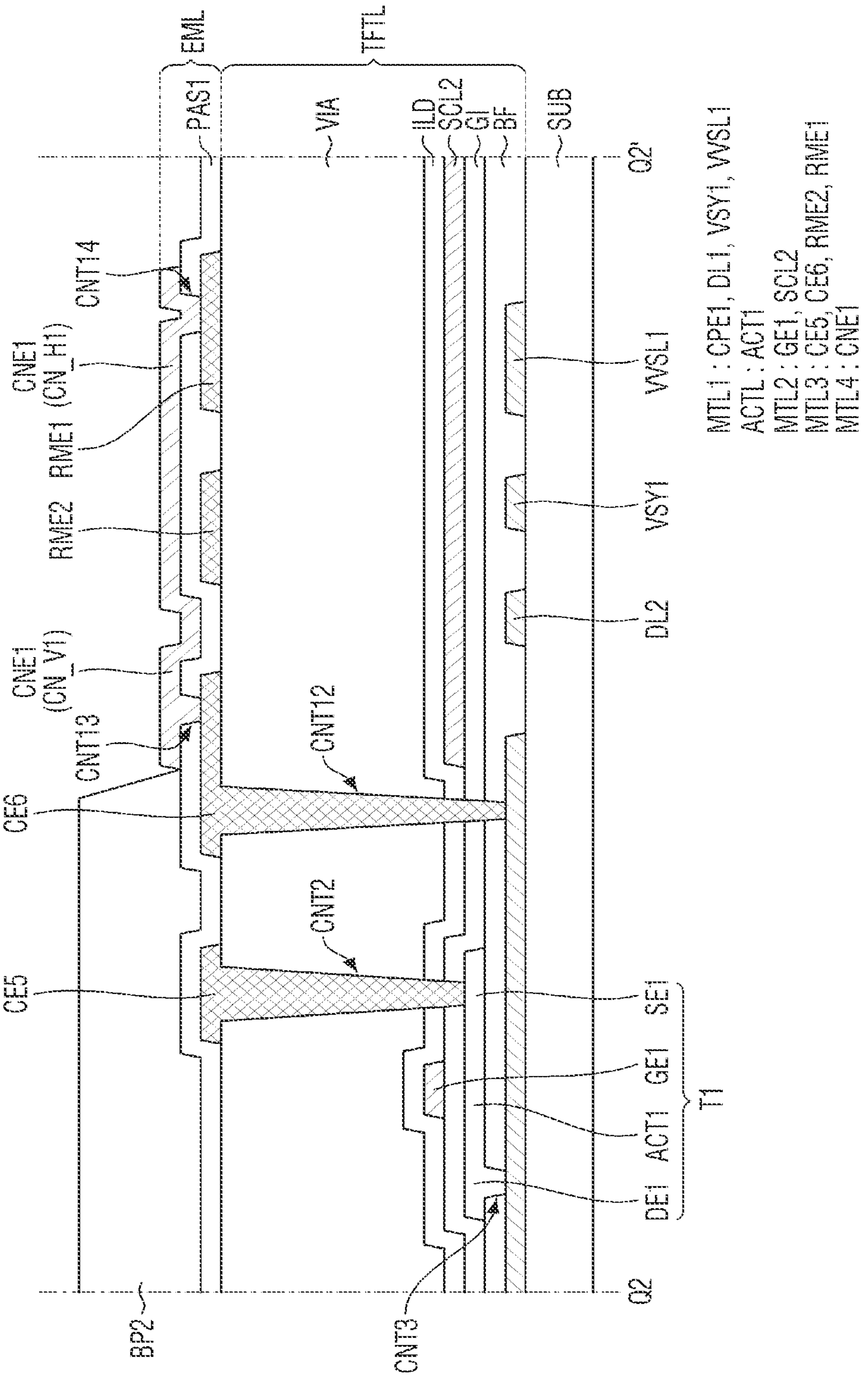
FIG. 9 is a cross-sectional view taken along the line Q2-Q2' of FIG. 8.
Figure 10:
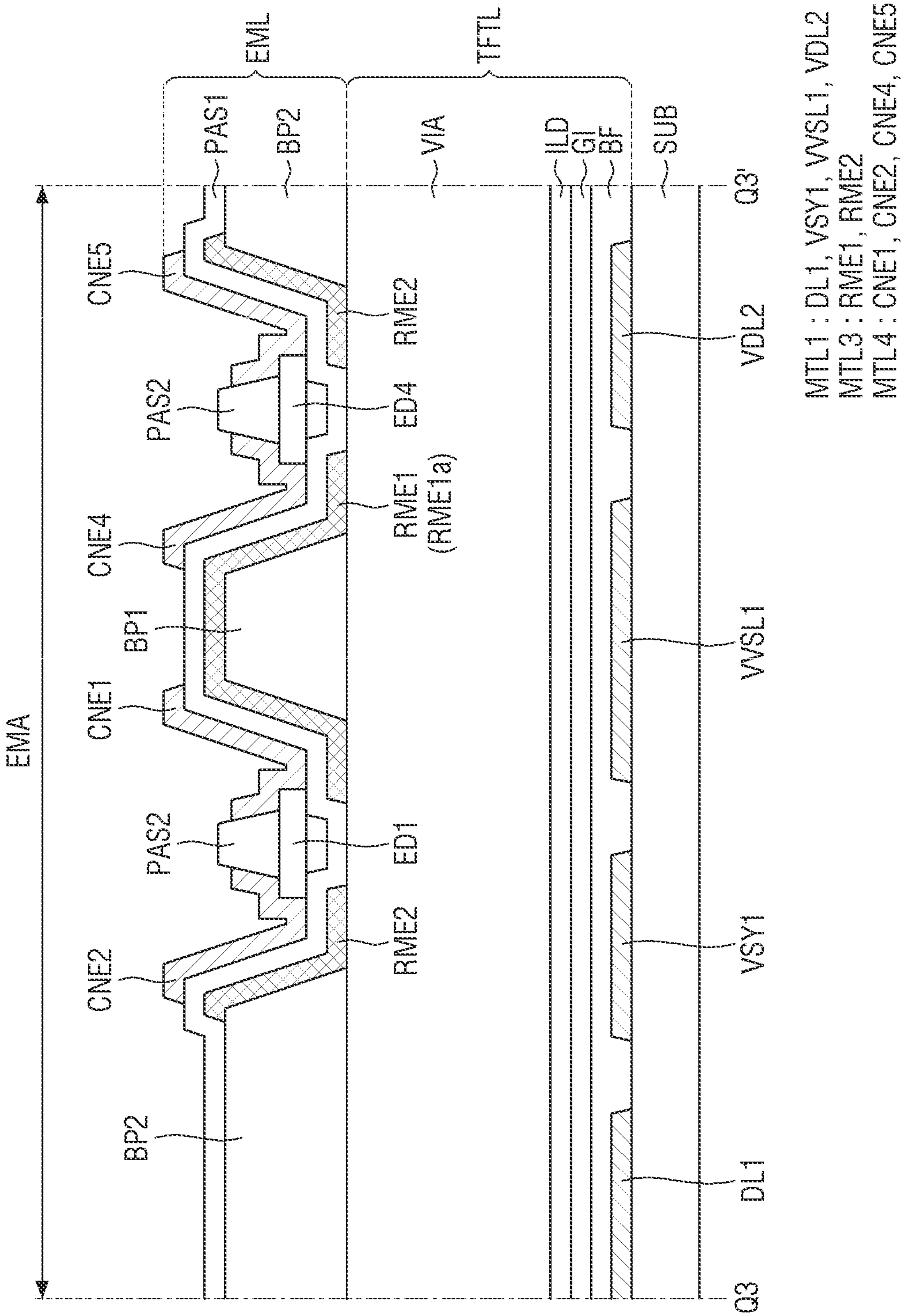
FIG. 10 is a cross-sectional view taken along the line Q3-Q3' of FIG. 8.
Figure 11:
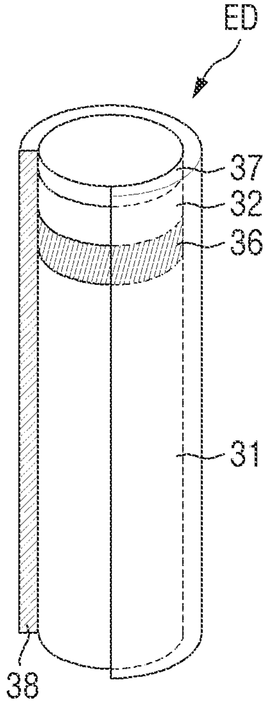
FIG. 11 is a view schematically illustrating a light emitting element according to an embodiment.

FIG. 8 is a plan view illustrating sub-pixels of the display device according to an embodiment. FIG. 9 is a cross-sectional view taken along the line Q2-Q2' of FIG. 8. FIG. 10 is a cross-sectional view taken along the line Q3-Q3' of FIG. 8. FIG. 11 is a view schematically illustrating a light emitting element according to an embodiment.

Referring to FIGS. 8 to 11, a light emitting element layer EML of the display device 10 may be disposed on a thin film transistor layer TFTL.

The thin film transistor layer TFTL may include a buffer layer BF, a first conductive layer MTL1, an active layer ACTL, a gate insulating layer GI, a second conductive layer MTL2, an interlayer insulating layer ILD, and a via layer VIA disposed on a substrate SUB.

The substrate SUB may be an insulating substrate. The substrate SUB may be made of an insulating material, such as glass, quartz, or a polymer resin. The substrate SUB may be a rigid substrate but may be, in other embodiments, a flexible substrate that may be bent, folded, or rolled.

The first conductive layer MTL1 may be directly disposed on a substrate SUB. The first conductive layer MTL1 may overlap the active layer ACTL of the first transistor ST1 in the display area DA. The first conductive layer MTL1 may include the first capacitor electrode CPE1, the first data line DL1, the first sink line VSY1, and the first vertical voltage line VVSL1. The first conductive layer MTL1 may include a material for blocking light to prevent light from being incident on the active layer ACTL of the first transistor ST1. In addition, the first conductive layer MTL1 may be electrically connected to the first source electrode SE1 of the first transistor ST1 through the contact holes (e.g., the contact openings) to suppress a change in a voltage of the first transistor ST1. For example, the first conductive layer MTL1 may be formed of an opaque metal material for blocking the transmission of light and may include a Ti/Cu double film in which a titanium layer and a copper layer are stacked. However, the present disclosure is not limited thereto, and a light blocking layer may be omitted.

The buffer layer BF may be entirely disposed on the substrate SUB including the first conductive layer MTL1. For example, the buffer layer BF may be disposed across the display area DA and the non-display area NDA of the substrate SUB. The buffer layer BF may be formed on the substrate SUB to protect the first transistors ST1 of each sub-pixel SPXn from moisture permeating through the substrate SUB, which may be vulnerable to moisture permeation, and may provide a planar upper surface. The buffer layer BF may be formed as a plurality of inorganic layers that are alternately stacked. For example, the buffer layer BF may be formed as multiple layers in which inorganic layers, including at least one of silicon oxide ($SiO_x$), silicon nitride ($SiN_x$), and silicon oxynitride ($SiO_xN_y$), are alternately stacked.

The active layer ACTL is disposed on the buffer layer BF. The active layer ACTL may include the first active region ACT1 of the first transistor ST1 disposed in the display area DA. The first active region ACT1 may be disposed to partially overlap a first gate electrode GE1 of the second conductive layer MTL2.

The active layer ACTL may include polycrystalline silicon, single crystal silicon, an oxide semiconductor, or the like. When the active layer ACTL includes an oxide semiconductor, the active layer ACTL may include a plurality of conductive regions and a channel region therebetween. The oxide semiconductor may be an oxide semiconductor including indium (In). For example, the oxide semiconductor may be indium tin oxide (ITO), indium zinc oxide (IZO), indium gallium oxide (IGO), indium zinc tin oxide (IZTO), indium gallium tin oxide (IGTO), indium gallium zinc tin oxide (IGZTO), or the like.

In another embodiment, the active layer ACTL may include (or may also include) polycrystalline silicon. The polycrystalline silicon may be formed by crystallizing amorphous silicon. In such an embodiment, each of the conductive regions of the active layer ACT may be a doped region doped with impurities.

The gate insulating layer GI is disposed on the active layer ACTL and the buffer layer BF across the display area DA and the non-display area NDA. The gate insulating layer GI may act as a gate insulating film of each of the transistors. The gate insulating layer GI may be formed as an inorganic layer including an inorganic material, for example, silicon oxide ($SiO_x$), silicon nitride ($SiN_x$), or silicon oxynitride ($SiO_xN_y$), or may be formed in a structure in which such inorganic layers are stacked.

The second conductive layer MTL2 is disposed on the gate insulating layer GI. The second conductive layer MTL2 may include the first gate electrode GE1 of the first transistor ST1 disposed in the display area DA. The first gate electrode GE1 may be disposed to overlap the channel region of the first active region ACT1 in the thickness direction. The second conductive layer MTL2 may be formed as a single layer or multiple layers made of any one of molybdenum (Mo), aluminum (Al), chromium (Cr), gold (Au), titanium (Ti), nickel (Ni), neodymium (Nd), and copper (Cu), or an alloy thereof. However, the present disclosure is not limited thereto.

The second conductive layer MTL2 may further include a second capacitor electrode CPE2 of a storage capacitor disposed in the display area DA, first and second gate lines SCL1 and SCL2, and the like.

The interlayer insulating layer ILD may be disposed on the second conductive layer MTL2. The interlayer insulating layer ILD may act as an insulating film between the second conductive layer MTL2 and other layers disposed thereon. In addition, the interlayer insulating layer ILD may be disposed to cover the second conductive layer MTL2 to protect the second conductive layer MTL2. The interlayer insulating layer ILD may be formed as an inorganic layer including an inorganic material, for example, silicon oxide ($SiO_x$), silicon nitride ($SiN_x$), or silicon oxynitride ($SiO_xN_y$), or may be formed in a structure in which such inorganic layers are stacked.

The via layer VIA may be disposed on the interlayer insulating layer ILD. The via layer VIA may be entirely disposed in the display area DPA to provide a planar upper surface (e.g., to perform a surface planarization function). The via layer VIA may include an organic insulating material, for example, an organic material, such as polyimide (PI).

The light emitting element layer EML disposed on the via layer VIA may include first and second bank patterns BP1 and BP2, first and second electrodes RME1 and RME2, first to fourth light emitting elements ED1, ED2, ED3, and ED4, a first insulating layer PAS1, a second insulating layer PAS2, and first to fifth connection electrodes CNE1, CNE2, CNE3, CNE4, and CNE5.

The first bank pattern BP1 may be disposed at a center of a light emitting area EMA, and the second bank pattern BP2 may be disposed on left and right sides of the light emitting area EMA. Each of the first and second bank patterns BP1 and BP2 may protrude in the thickness direction on the via layer VIA. Each of the first and second bank patterns BP1 and BP2 may have inclined side surfaces. Light emitted from the light emitting elements ED may be reflected by the electrodes RME1 and RME2 disposed on the first and second bank patterns BP1 and BP2 and emitted in an upward direction of the via layer VIA. The first and second bank patterns BP1 and BP2 may provide an area in which the light emitting elements ED are disposed and may act as a reflective partition to reflect light emitted from the light emitting element ED in the upwardly direction. The side surfaces of the first and second bank patterns BP1 and BP2 may be inclined in a linear shape but are not limited thereto, and the outer surfaces of the first and second bank patterns BP1 and BP2 may have a semicircle or semi-elliptical shape. The first and second bank patterns BP1 and BP2 may include an organic insulating material, such as polyimide (PI), but are not limited thereto. In addition, the first and second bank patterns BP1 and BP2 may be integrally formed by being connected to each other in an area other than the light emitting area EMA. However, the present disclosure is not limited thereto, and the first and second bank patterns BP1 and BP2 may be separated from each other.

The first and second electrodes RME1 and RME2 may be disposed on the via layer VIA and the first and second bank patterns BP1 and BP2. The first electrode RME1 and the second electrode RME2 may be included in the third conductive layer MTL3. As described above, the first electrode RME1 and the second electrode RME2 may be separated from other first and second electrodes RME1 and RME2 in the separation portion RMO, respectively. For example, the separation portion RMO may be disposed between the light emitting areas EMA of the sub-pixel SPXn adjacent in the second direction DR2, and the first electrode RME1 and the second electrode RME2 may be separated from other first and second electrodes RME1 and RME2 disposed in the sub-pixel SPXn adjacent in the second direction DR2 in the separation portion RMO. However, the present disclosure is not limited thereto, and some of the first and second electrodes RME1 and RME2 are not separated for each sub-pixel SPXn but may be disposed to extend beyond the sub-pixel SPXn adjacent in the second direction DR2, or only one of the first electrode RME1 and the second electrode RME2 may be separated.

The second electrode RME2 may be formed as a floating electrode, and the first electrode RME1 may be connected to the first connection electrode CNE1 through the fourteenth contact hole CNT14 to be connected to the first transistor ST1. The second electrode RME2 may be connected to the first connection electrode CNE1 to form an equipotential. Although one first electrode RME1 and one second electrode RME2 are disposed for each sub-pixel SPXn in the illustrated embodiment, the present disclosure is not limited thereto and a greater numbers of first electrodes RME1 and second electrodes RME2 may be disposed for each sub-pixel SPXn.

The first electrode RME1 and the second electrode RME2 may be disposed on the first and second bank patterns BP1 and BP2, respectively. The first electrode RME1 may be disposed to completely cover the first bank pattern BP1, and the second electrode RME2 may be disposed to cover only one side surface of the second bank pattern BP2. At least portions of the first electrode RME1 and the second electrode RME2 may be directly disposed on the via layer VIA such that the first electrode RME1 and the second electrode RME2 may be disposed on the same plane. However, the present disclosure is not limited thereto.

The first electrode RME1 and the second electrode RME2 may include a conductive material having high reflectance. For example, the first electrode RME1 and the second electrode RME2 may include a metal, such as silver (Ag), copper (Cu), or aluminum (Al) as a material having high reflectance or may include an alloy including aluminum (Al), nickel (Ni), lanthanum (La), or the like. The first electrode RME1 and the second electrode RME2 may reflect light emitted from the light emitting element ED that travels to the side surfaces of the first and second bank patterns BP1 and BP2 to be emitted in an upward direction of each sub-pixel SPXn.

However, the present disclosure is not limited thereto, and the first electrode RME1 and the second electrode RME2 may further include a transparent conductive material. For example, the first electrode RME1 and the second electrode RME2 may include a material such as indium tin oxide (ITO), indium zinc oxide (IZO), or indium tin zinc oxide (ITZO). In some embodiments, the first electrode RME1 and the second electrode RME2 may have a structure in which one or more layers made of the transparent conductive material and one or more layers made of the metal having high reflectance are stacked, or they may be formed as one layer including the transparent conductive material and the metal having high reflectance. For example, the first electrode RME1 and the second electrode RME2 may have a stacked structure such as ITO/silver (Ag)/ITO, ITO/Ag/IZO, or ITO/Ag/ITZO/IZO.

The first electrode RME1 and the second electrode RME2 may also be utilized to form an electric field in the sub-pixel SPXn to align the light emitting elements ED. The light emitting element ED may be disposed (or arranged) between the first electrode RME1 and the second electrode RME2 by the electric field formed on the first electrode RME1 and the second electrode RME2. The light emitting elements ED of the display device 10 may be jetted (e.g., deposited) onto the first electrode RME1 and the second electrode RME2 through an inkjet printing process. When (or after) ink including the light emitting elements ED is jetted onto the first electrode RME1 and the second electrode RME2, an alignment signal is applied to the first electrode RME1 and the second electrode RME2 to form (or generate) an electric field. The light emitting elements ED dispersed in the ink may be aligned on (e.g., between) the first electrode RME1 and the second electrode RME2 by a dielectrophoretic force caused by the electric field generated between the first electrode RME1 and the second electrode RME2.

The first insulating layer PAS1 may be disposed on the via layer VIA. The first insulating layer PAS1 may be disposed on the via layer VIA to cover the first and second bank patterns BP1 and BP2 and the first electrode RME1 and the second electrode RME2. The first insulating layer PAS1 may insulate the first electrode RME1 and the second electrode RME2 from each other while protecting the first electrode RME1 and the second electrode RME2. In addition, the first insulating layer PAS1 may prevent the light emitting element ED disposed on the first insulating layer PAS1 from being in direct contact with and being damaged by other members.

The plurality of light emitting elements ED may be disposed between the first and second bank patterns BP1 and BP2 or on different electrodes RME1 and RME2. Some of the light emitting elements ED may be disposed between the first bank pattern BP1 and the second bank pattern BP2 disposed on the left side of the first bank pattern BP1, and others of the light emitting elements ED may be disposed between the first bank pattern BP1 and the second bank pattern BP2 disposed on the right side of the first bank pattern BP1. According to an embodiment, the light emitting elements ED may include a first light emitting element ED1 and a second light emitting element ED2 disposed between the first bank pattern BP1 and the second bank pattern BP2 disposed on the left side of the first bank pattern BP1, and a third light emitting element ED3 and a fourth light emitting element ED4 disposed between the first bank pattern BP1 and the second bank pattern BP2 disposed on the right side of the first bank pattern BP1. The first light emitting element ED1 and the second light emitting element ED2 may be disposed on the first electrode RME1 and the second electrode RME2 disposed on the left side of the first electrode RME1, respectively, and the third light emitting element ED3 and the fourth light emitting element ED4 may be disposed on the first electrode RME1 and the second electrode RME2 disposed on the right side of the first electrode RME1, respectively. The first light emitting element ED1 and the second light emitting element ED2 may be disposed adjacent to the left side in the light emitting area EMA of the corresponding sub-pixel SPXn, and the third light emitting element ED3 and the fourth light emitting element ED4 may be disposed adjacent to the right side in the light emitting area EMA of the corresponding sub-pixel SPXn.

However, the light emitting elements ED are not classified according to their position in the light emitting area EMA but may be classified according to a connection relationship with connection electrodes CNE, which will be described later. Each of the light emitting elements ED may have both ends (e.g., opposite ends) in contact with different connection electrodes CNE according to an arrangement structure of the connection electrodes CNE and may be classified into different light emitting elements ED according to the type of the connection electrode CNE it is in contact therewith.

The second insulating layer PAS2 may be disposed on the plurality of light emitting elements ED. The second insulating layer PAS2 includes a pattern portion extending in the second direction DR2 between the bank patterns BP1 and BP2 and disposed on the plurality of light emitting elements ED. The pattern portion may be disposed to partially surround an outer surface of the light emitting element ED and may not cover both sides or both ends of the light emitting element ED. The pattern portion may form a linear or island-shaped pattern in each sub-pixel SPXn in a plan view. The pattern portion of the second insulating layer PAS2 may protect the light emitting element ED, and at the same time, may fix the light emitting elements ED so as not to be separated in a process of manufacturing the display device 10. In addition, the second insulating layer PAS2 may be disposed to fill a space between the light emitting element ED and the first insulating layer PAS1 on a lower side thereof. In addition, a portion of the second insulating layer PAS2 may be disposed on the first and second bank patterns BP1 and BP2 and on the first insulating layer PAS1. According to an embodiment, the second insulating layer PAS2 may have openings exposing lower layers in portions corresponding to the separation portion RMO and portions exposing the first and second ends of the light emitting elements ED in the light emitting area EMA.

A fourth conductive layer MTL4 may be disposed on the first insulating layer PAS1 and the plurality of light emitting elements ED. The fourth conductive layer MTL4 may include first to fifth connection electrodes CNE1, CNE2, CNE3, CNE4, and CNE5 disposed in each sub-pixel SPXn.

The first connection electrode CNE1 may be connected to a sixth connection electrode CE6 of the third conductive layer MTL3 through a thirteenth contact hole (e.g., a thirteenth contact opening) CNT13. The first connection electrode CNE1 may include a first horizontal portion CN_H1 and a second horizontal portion CN_H2 extending in the first direction DR1, and a first vertical portion CN_V1 and a second vertical portion CN_V2 extending in the second direction DR2.

The first horizontal portion CN_H1 may be a portion extending from the thirteenth contact hole CNT13 in the first direction DR1. For example, the first horizontal portion CN_H1 may be a portion extending from the second electrode RME2 in the first direction DR1. One end of the first horizontal portion CN_H1 may overlap the thirteenth contact hole CNT13 and the other end thereof may overlap the first vertical voltage line VVSL1 and the first electrode RME1. The first horizontal portion CN_H1 may cross (e.g., may intersect) the first data line DL1 and the first sync line VSY1. The other end of the first horizontal portion CN_H1 may be connected to the first electrode RME1 through the fourteenth contact hole CNT14. Therefore, as will be described later, the first connection electrode CNE1 and the first portion RME1*a* of the first electrode RME1 may be electrically connected. The first horizontal portion CN_H1 may be connected to the first transistor ST1 through the sixth connection electrode CE6. Therefore, the first horizontal portion CN_H1 may transmit the driving signal applied from the first transistor ST1 to the light emitting element ED.

The first vertical portion CN_V1 may extend in an intersecting direction from the first horizontal portion CN_H1. For example, the first vertical portion CN_V1 may be a portion extending in the second direction DR2 from the thirteenth contact hole CNT13. One end of the first vertical portion CN_V1 may overlap the thirteenth contact hole CNT13 and the other end thereof may overlap the first gate line SCL1. The first vertical portion CN_V1 may overlap the pixel circuit of each sub-pixel SPXn. For example, the first vertical portion CN_V1 may overlap the first transistor ST1 and the first capacitor C1.

The second horizontal portion CN_H2 may be a portion extending and branching from the first vertical portion CN_V1 and extending in the first direction DR1. For example, the second horizontal portion CN_H2 may extend in parallel with the first horizontal portion CN_H1. The second horizontal portion CN_H2 may intersect the first data line DL1 and the first sync line VSY1, and one end of the second horizontal portion CN_H2 may overlap the first vertical voltage line VVSL1. The second horizontal portion CN_H2 may overlap the second transistor ST2 and the first data line DL1. The second horizontal portion CN_H2 may overlap the first electrode RME1 and the second electrode RME2.

The second vertical portion CN_V2 may be a portion branching from the second horizontal portion CN_H2 and extending in the second direction DR2 and may extend in parallel with the first vertical portion CN_V1. The second vertical portion CN_V2 may extend toward the first horizontal portion CN_H1. The second vertical portion CN_V2 may overlap the first vertical voltage line VVSL1 and the first portion RME1*a* of the first electrode RME1 and may extend in parallel therewith. The second vertical portion CN_V2 of the first connection electrode CNE1 may be in contact with one end of the first light emitting element ED1. The second vertical portion CN_V2 of the first connection electrode CNE1 may correspond to an anode electrode of the first light emitting element ED1 but is not limited thereto.

The second connection electrode CNE2 may be parallel to the second vertical portion CN_V2 of the first connection electrode CNE1 and may generally extend in the second direction DR2. The second connection electrode CNE2 may have a shape that extends in the second direction DR2, is bent at an angle (e.g., a predetermined angle), and extends in the second direction DR2 again. An upper side of the second connection electrode CNE2 may overlap the second electrode RME2 and the first sink line VSY1 in a plan view and may be in contact with the other end of the first light emitting element ED1. A lower side of the second connection electrode CNE2 may overlap the first portion RME1*a* of the first electrode RME1 and the first vertical voltage line VVSL1 in a plan view and may be in contact with one end of the second light emitting element ED2.

The third connection electrode CNE3 may be disposed to surround the lower side of the second connection electrode CNE2 in a plan view. The third connection electrode CNE3 may have a shape that extends in one side in the second direction DR2, is bent in the first direction DR1, and extends to the other side in the second direction DR2 again. A left side of the third connection electrode CNE3, in a plan view, may overlap the second electrode RME2 and the first sink line VSY1 and may be in contact with the other end of the second light emitting element ED2. A right side of the third connection electrode CNE3, in a plan view, may overlap the first portion RME1*a* of the first electrode RME1 and the first vertical voltage line VVSL1 and may be in contact with one end of the third light emitting element ED3.

The fourth connection electrode CNE4 may be parallel to a portion of the third connection electrode CNE3 and may generally extend in the second direction DR2. The fourth connection electrode CNE4 may have a shape that extends in the second direction DR2, is bent at an angle (e.g., a predetermined angle), and extends in the second direction DR2 again. A lower side of the fourth connection electrode CNE4 may overlap the second electrode RME2 and the second data line DL2 of the adjacent sub-pixel SPXn, for example, the second sub-pixel SPX2, in a plan view and may be in contact with the other end of the third light emitting element ED3. An upper side of the fourth connection electrode CNE4 may overlap the first portion RME1*a* of the first electrode RME1 and the first vertical voltage line VVSL1 in a plan view and may be in contact with one end of the fourth light emitting element ED4.

The fifth connection electrode CNE5 may face the upper side of the fourth connection electrode CNE4 and may extend in parallel therewith. The fifth connection electrode CNE5 may extend in the second direction DR2. The fifth connection electrode CNE5 may overlap the second electrode RME2 and the second data line DL2 of the adjacent sub-pixel SPXn, for example, the second sub-pixel SPX2, and may be in contact with the other end of the fourth light emitting element ED4. The fifth connection electrode CNE5 may be connected to the horizontal voltage line HVSL through the fifteenth contact hole CNT15 to receive a low potential voltage.

As described above, the first connection electrode CNE1 may be in contact with one end of the first light emitting element ED1, and the second connection electrode CNE2 may be in contact with the other end of the first light emitting element ED1. The second connection electrode CNE2 may be in contact with one end of the second light emitting element ED2, and the third connection electrode CNE3 may be in contact with the other end of the second light emitting element ED2. The third connection electrode CNE3 may be in contact with one end of the third light emitting element ED3, and the fourth connection electrode CNE4 may be in contact with the other end of the third light emitting element ED3. The fourth connection electrode CNE4 may be in contact with one end of the fourth light emitting element ED4, and the fifth connection electrode CNE5 may be in contact with the other end of the fourth light emitting element ED4.

The plurality of light emitting elements ED may be classified into different light emitting elements ED according to the connection electrodes CNE1, CNE2, CNE3, CNE4, and CNE5 with which ends thereof are in contact in response to the arrangement structure of the connection electrodes CNE1, CNE2, CNE3, CNE4, and CNE5. The plurality of light emitting elements ED may be connected in series with each other through the connection electrodes CNE1, CNE2, CNE3, CNE4, and CNE5. Because the display device 10 may include a greater number of light emitting elements ED for each sub-pixel SPXn and may form a series connection therebetween, the amount of light emission per unit area may be increased.

FIG. 11 is a schematic view of a light emitting element according to an embodiment.

Referring to FIG. 11, the light emitting element ED is a particle type element and may have a rod or cylindrical shape having an aspect ratio (e.g., a predetermined aspect ratio). The light emitting element ED may have a size of a nanometer scale (e.g., about 1 nm or more and less than about 1 μm) to a micrometer scale (e.g., about 1 μm or more and less than about 1 mm). In an embodiment, the light emitting element ED may have a size of a nanometer scale or have a size of a micrometer scale in both a diameter and a length thereof. In some embodiments, the diameter of the light emitting element ED may have a size of a nanometer scale while the length of the light emitting element ED may have a size of a micrometer scale. In some embodiments, some light emitting elements ED may have a size of a nanometer scale in a diameter and/or a length while other light emitting elements ED may have a size of a micrometer scale in a diameter and/or a length.

In an embodiment, the light emitting element ED may be an inorganic light emitting diode. In such an embodiment, the light emitting element ED may include a semiconductor layer doped with an arbitrary conductive type (e.g., p-type or n-type) impurity. The semiconductor layer may receive an electrical signal applied from an external power source and may emit the electrical signal as light of a specific wavelength band.

The light emitting element ED according to an embodiment may include a first semiconductor layer 31, a light emitting layer 36, a second semiconductor layer 32, and an electrode layer 37 that are sequentially stacked in a length direction. The light emitting element may further include an insulating film 38 surrounding outer surfaces of the first semiconductor layer 31, the second semiconductor layer 32, and the light emitting layer 36.

The first semiconductor layer 31 may be an n-type semiconductor. When the light emitting element ED emits light of a blue wavelength band, the first semiconductor layer 31 may include a semiconductor material having a composition ratio of $Al_xGa_yIn_{(1-x-y)}N$ (where $0 \le x \le 1$, $0 \le y \le 1$, and $0 \le x+y \le 1$). For example, the semiconductor material may be any one or more of AlGaInN, GaN, AlGaN, InGaN, AlN, and InN doped with an n-type. The first semiconductor layer 31 may be doped with an n-type dopant, which may be Si, Ge, Sn, Se, or the like. For example, the first semiconductor layer 31 may be made of n-GaN doped with n-type Si. A length of the first semiconductor layer 31 may be in the range of about 1.5 μm to about 5 μm but is not limited thereto.

The second semiconductor layer 32 is disposed on a light emitting layer 36 to be described later. The second semiconductor layer 32 may be a p-type semiconductor, and when the light emitting element ED is configured to emit light of a blue or green wavelength band, the second semiconductor layer 32 may include a semiconductor material having a composition ratio of $Al_xGa_yIn_{(1-x-y)}N$ (where $0 \le x \le 1$, $0 \le y \le 1$, and $0 \le x+y \le 1$). For example, the semiconductor material may be any one or more of AlGaInN, GaN, AlGaN, InGaN, AlN, and InN doped with a p-type. The second semiconductor layer 32 may be doped with a p-type dopant, which may be Mg, Zn, Ca, Ba, or the like. For example, the second semiconductor layer 32 may be made of p-GaN doped with p-type Mg. A length of the second semiconductor layer 32 may be in the range of about 0.05 μm to about 0.10 μm but is not limited thereto.

Although the first semiconductor layer 31 and the second semiconductor layer 32 are illustrated as being configured as one layer, the present disclosure is not limited thereto. The first semiconductor layer 31 and the second semiconductor layer 32 may include a greater number of layers, for example, a clad layer or a tensile strain barrier reducing (TSBR) layer, according to a material of the light emitting layer 36.

The light emitting layer 36 is disposed between the first semiconductor layer 31 and the second semiconductor layer 32. The light emitting layer 36 may include a material having a single or multiple quantum well structure. When the light emitting layer 36 includes the material having the multiple quantum well structure, the light emitting layer 36 may have a structure in which a plurality of quantum layers and well layers are alternately stacked. The light emitting layer 36 may emit light by a combination of electron-hole pairs according to electrical signals applied through the first semiconductor layer 31 and the second semiconductor layer 32. When the light emitting layer 36 emits light of a blue wavelength band, the light emitting layer 36 may include a material such as AlGaN or AlGaInN. When the light emitting layer 36 has the multiple quantum well structure, that is, the structure in which the quantum layer and the well layer are alternately stacked, the quantum layer may include a material such as AlGaN or AlGaInN and the well layer may include a material such as GaN or AlInN. For example, the light emitting layer 36 may include AlGaInN as the quantum layer and AlInN as the well layer to emit blue light having a central wavelength band in a range of about 450 nm to about 495 nm, as described above.

However, the present disclosure is not limited thereto, and the light emitting layer 36 may have a structure in which a type of semiconductor material having a large band gap energy and a semiconductor material having a small band gap energy are alternately stacked with each other and may include other Group III to Group V semiconductor materials according to a wavelength band of light to be emitted. The light emitted by the light emitting layer 36 is not limited to light of a blue wavelength band, and in some embodiments, the light emitting layer 36 may emit light of red and green wavelength bands. A length of the light emitting layer 36 may be in the range of about 0.05 μm to about 0.10 μm but is not limited thereto.

The light emitted from the light emitting layer 36 may be emitted not only to an outer surface of the light emitting element ED in a length direction but also to both side surfaces of the light emitting element ED. In other words, directivity of the light emitted from the light emitting layer 36 is not limited to one direction.

The electrode layer 37 may be an ohmic contact electrode. However, the present disclosure is not limited thereto, and the electrode layer 37 may be a Schottky contact electrode. The light emitting element ED may include at least one electrode layer 37. Although the light emitting element ED is illustrated as including one electrode layer 37, the present disclosure is not limited thereto. In some embodiments, the light emitting element ED may include a greater number of electrode layers 37 or may be omitted. The description of the light emitting element ED may be equally applied even if the number of electrode layers 37 is changed or the light emitting element ED further includes another structure.

The electrode layer 37 may decrease resistance between the light emitting element ED and the electrode or the contact electrode when the light emitting element ED is electrically connected to the electrode or the contact electrode in the display device 10 according to an embodiment. The electrode layer 37 may include a conductive metal. For example, the electrode layer 37 may include at least one of aluminum (Al), titanium (Ti), indium (In), gold (Au), silver (Ag), indium tin oxide (ITO), indium zinc oxide (IZO), and indium tin zinc oxide (ITZO). In addition, the electrode layer 37 may include a semiconductor material doped with an n-type or a p-type. The electrode layer 37 may include the same material or different materials.

The insulating film 38 is disposed to surround outer surfaces of the plurality of semiconductor layers and electrode layers described above. For example, the insulating film 38 may be disposed to surround at least the outer surface of the light emitting layer 36 and may extend in one direction in which the light emitting element ED extends. The insulating film 38 may protect the underlying members. The insulating film 38 may be formed to surround side surface portions of the members but may expose both ends of the light emitting element ED in the length direction.

Although the insulating film 38 is illustrated as extending in the length direction of the light emitting element ED to cover side surfaces of the first semiconductor layer 31 to the electrode layer 37, the present disclosure is not limited thereto. The insulating film 38 may cover only outer surfaces of some semiconductor layers, including the light emitting layer 36, or may cover only a portion of the outer surface of the electrode layer 37 to partially expose the outer surface of each electrode layer 37. In addition, the insulating film 38 may be formed so that an upper surface thereof is rounded in a cross-sectional view in an area adjacent to at least one end of the light emitting element ED. A thickness of the insulating film 38 may be in a range of about 10 nm to about 1.0 μm but is not limited thereto. The thickness of the insulating film 38 may be, in one embodiment, about 40 nm.

The insulating film 38 may include materials having insulating properties, such as silicon oxide ($SiO_x$), silicon nitride ($SiN_x$), silicon oxynitride ($SiO_xN_y$), aluminum nitride ($AlN_x$), and aluminum oxide (e.g., $Al_2O_3$). Although the insulating film 38 is illustrated as being a single layer, the present disclosure is not limited thereto. In some embodiments, the insulating film 38 may be formed as a multilayer structure in which a plurality of layers are stacked. Accordingly, an electrical short circuit that may occur when the light emitting layer 36 is in direct contact with an electrode through which an electrical signal is transmitted to the light emitting element ED may be prevented. In addition, the insulating film 38 protects the outer surface of the light emitting element ED as well as the light emitting layer 36 and may, thus, prevent a decrease in light emission efficiency.

In addition, an outer surface of the insulating film 38 may be surface-treated. The light emitting elements ED may be jetted onto the electrode in a state of being dispersed in an ink and then aligned. To maintain the light emitting elements ED in a state in which the light emitting elements ED are dispersed without being clustered with other adjacent light emitting elements ED in the ink, a hydrophobic or hydrophilic treatment may be performed on a surface of the insulating film 38. For example, the outer surface of the insulating film 38 may be surface-treated with a material such as stearic acid or 2,3-naphthalene dicarboxylic acid.

Figure 12:
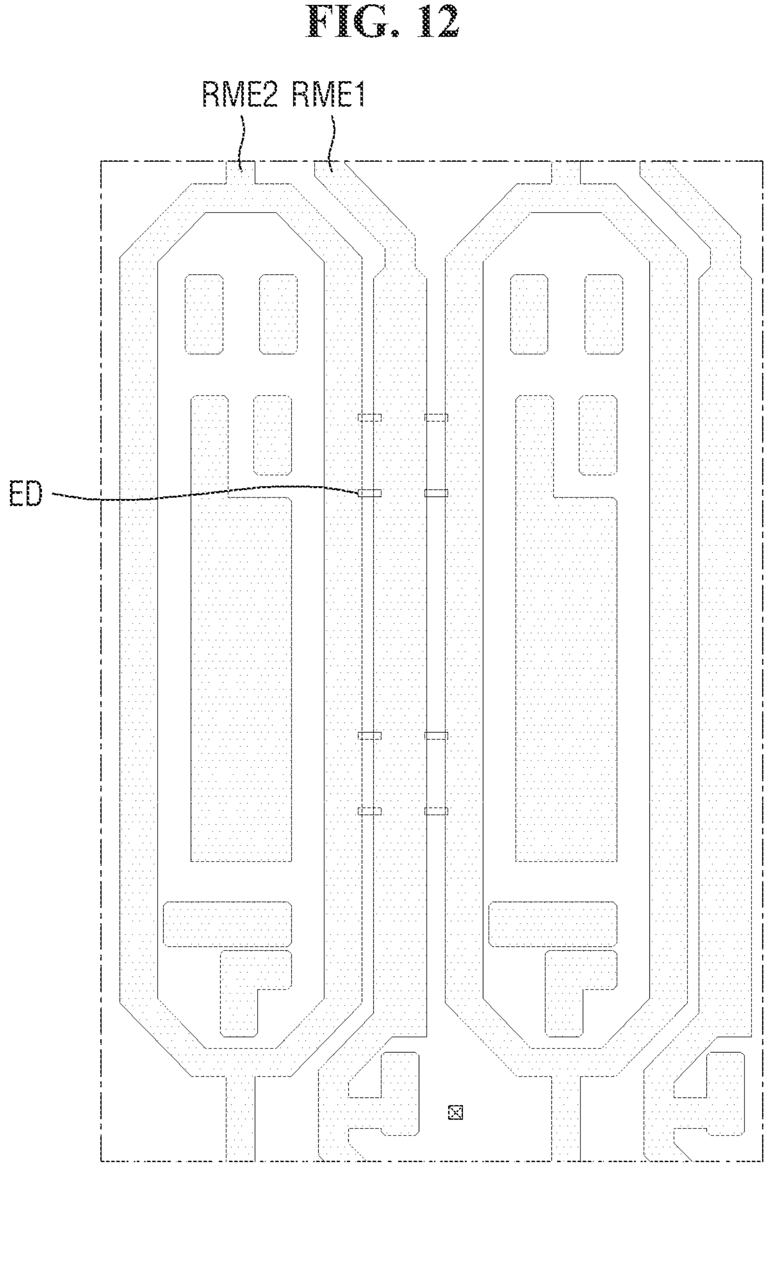
FIGS. 12 and 13 are plan views illustrating a process of aligning light emitting elements of a display device according to an embodiment.
Figure 13:
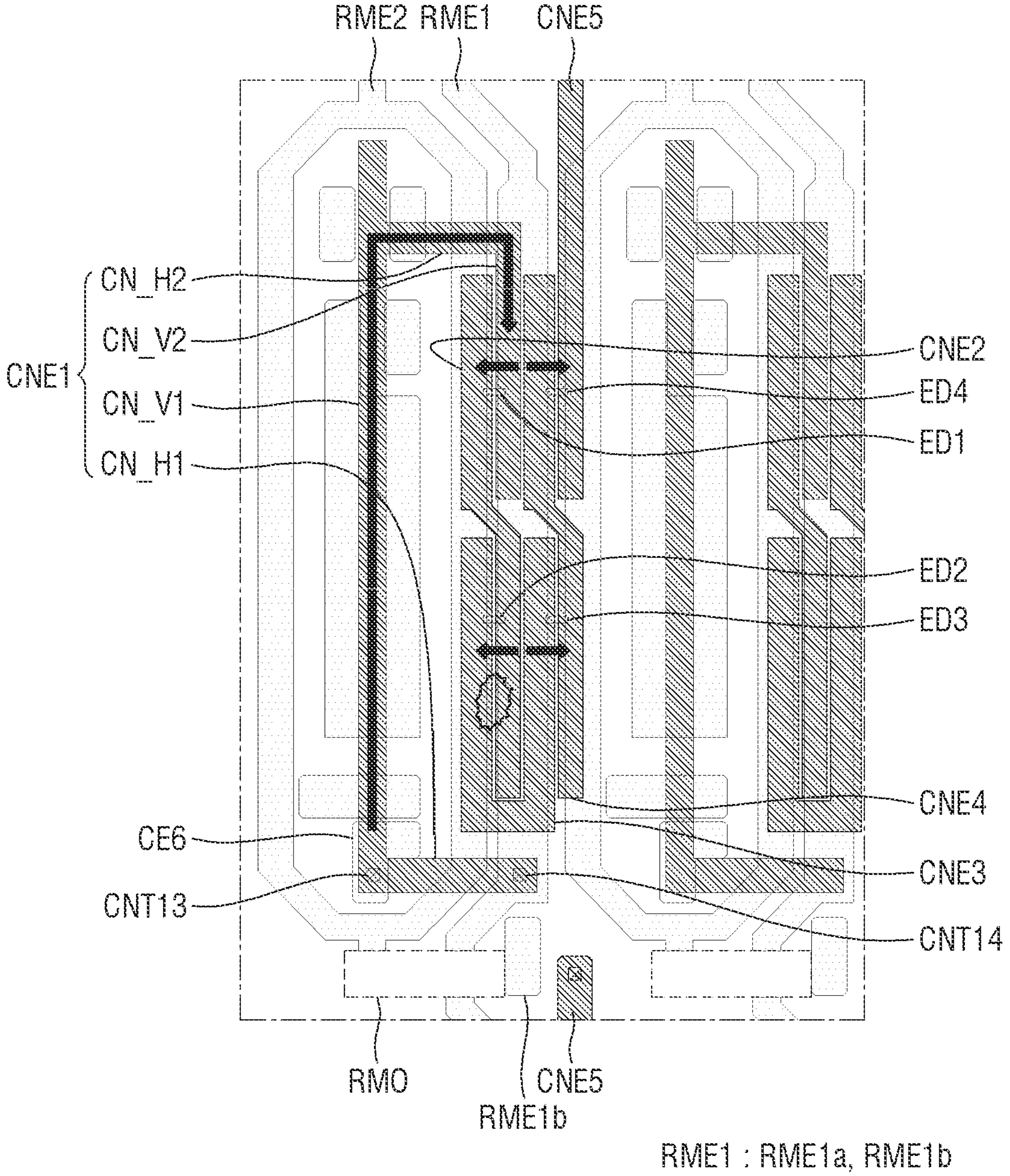

FIGS. 12 and 13 are plan views illustrating a process of aligning light emitting elements of a display device according to an embodiment. FIG. 12 illustrates a state in which the light emitting elements ED are aligned on the electrodes RME1 and RME2, and FIG. 13 illustrates a state in which the connection electrodes CNE1, CNE2, CNE3, CNE4, and CNE5 are formed after the light emitting elements ED are aligned.

Referring to FIGS. 12 and 13 together with FIGS. 4 to 8, the first electrode RME1 and the second electrode RME2 may be disposed in each sub-pixel SPXn. The first electrode RME1 may receive an alignment signal through an external device in a process of aligning the plurality of light emitting elements ED. The second electrode RME2 may receive a low potential voltage from the horizontal voltage line HVSL. The first electrode RME1 and the second electrode RME2 may extend in the second direction DR2 and may be alternately disposed in the first direction DR1. The first electrode RME1 and the second electrode RME2 may be continuously disposed in the second direction DR2. For example, even in the sub-pixels SPXn adjacent in the second direction DR2, the first electrode RME1 and the second electrode RME2 are continuously connected.

When the first electrode RME1 receives the alignment signal and the second electrode RME2 receives the low potential voltage, an electric field may be formed between the first and second electrodes RME1 and RME2. For example, the plurality of light emitting elements ED may be jetted onto the first and second electrodes RME1 and RME2 through an inkjet printing process, and the plurality of light emitting elements ED dispersed in ink may be aligned due to a dielectrophoresis force by the electric field formed between the first and second electrodes RME1 and RME2. For example, the plurality of light emitting elements ED of the first sub-pixel SPX1 may be aligned between the first electrode RME1 of the first sub-pixel SPX1 and the second electrode RME2 on the left side of the first electrode RME1 and may be aligned between the first electrode RME1 of the first sub-pixel SPX1 and the second electrode RME2 of the second sub-pixel SPX2. Because the first electrode RME1 and the second electrode RME2 of each of the first to third sub-pixels SPX1, SPX2, and SPX3 have the same structure, deviation of the alignment signal may be reduced or minimized in the process of aligning the light emitting elements ED of the first to third sub-pixels SPX1, SPX2, and SPX3.

As illustrated in FIG. 13, after the process of aligning the light emitting elements ED is completed, the first electrode RME1 and the second electrode RME2 are separated from each other. For example, the first electrode RME1 and the second electrode RME2 may be separated at the separation portion RMO on the lower or upper side of each sub-pixel SPXn in a plan view. Accordingly, the first electrode RME1 and the second electrode RME2 disposed in each sub-pixel SPXn may be separated from the first electrode RME1 and the second electrode RME2 of the other sub-pixel SPXn adjacent in the second direction DR2.

The first electrode RME1 may be separated into a first portion RME1*a* and a second portion RME1*b* at the separation portion RMO. The first portion RME1*a* and the second portion RME1*b* of the first electrode RME1 are separated at the separation portion RMO to form an island shape, and the first electrode RME1 is disconnected from the horizontal voltage line VVSL. The second electrode RME2 may be separated by the separation portion RMO to form a floating electrode.

The first connection electrode CNE1 may be connected to the sixth connection electrode CE6 through the thirteenth contact hole CNT13 penetrating through the first insulating layer PAS1. For example, one end of the first horizontal portion CN_H1 of the first connection electrode CNE1 may be connected to the sixth connection electrode CE6. Because the sixth connection electrode CE6 is connected to the first transistor ST1, a driving current may be applied to the first connection electrode CNE1 from the first transistor ST1. In addition, the other end of the first horizontal portion CN_H1 of the first connection electrode CNE1 may be connected to the first portion RME1*a* of the first electrode RME1 through the fourteenth contact hole CNT14 penetrating through the first insulating layer PAS1. Accordingly, a driving current may be applied to the first portion RME1*a* of the first electrode RME1, which is in a floating state, from the first transistor ST1 in the same manner as the first connection electrode CNE1.

When the first electrode RME1 exists in a floating state, a peripheral potential difference may occur as the floating electrode is disposed on a lower side of the first connection electrode CNE1 and, thus, a difference in coupling capacitance may occur. Such coupling capacitance causes a difference in luminance with a peripheral portion so that a stain may be visually recognized. In addition, when a different signal is applied to the first electrode RME1 due to a short circuit between the first electrode RME1 and the connection electrodes CNE1, CNE2, CNE3, CNE4, and CNE5, a bright spot or a dark spot may occur.

In an embodiment, by separating the first electrode RME1 and the second electrode RME2 at the separation portion RMO, respectively, and connecting the first portion RME1*a* of the first electrode RME1 and the first connection electrode CNE1, the same driving current may be applied thereto from the first transistor ST1. Even if any one of the first electrode RME1 and the connection electrodes CNE1, CNE2, CNE3, CNE4, and CNE5 is short-circuited, because the driving current, for example, the anode signal, is applied to the short-circuited connection electrode from the first electrode RME1, some light emitting elements ED may emit light.

As illustrated in FIG. 13, when the lower side of the second connection electrode CNE2 is short-circuited from the first electrode RME1, the anode signal is applied to the entire second connection electrode CNE2 from the first electrode RME1. Because the anode signal is applied to both the upper side of the second connection electrode CNE2 and the first connection electrode CNE1, the first light emitting element ED1 connected to the second connection electrode CNE2 and the first connection electrode CNE1, respectively, does not emit light. On the other hand, the second light emitting element ED2 connected to the second connection electrode CNE2 and the third connection electrode CNE3, respectively, emits light because a potential difference is formed between the second connection electrode CNE2 and the third connection electrode CNE3. Similarly, the third light emitting element ED3 and the fourth light emitting element ED4 may also emit light.

That is, when any one of the first electrode RME1 and the connection electrodes CNE1, CNE2, CNE3, CNE4, and CNE5 is short-circuited, the light emitting elements ED disposed in a current flow path may emit light from the light emitting elements ED in the portion where the short circuit occurred. As illustrated in FIG. 13, when a short circuit occurs in a portion where the second light emitting element ED2 is disposed, the second light emitting element ED2, the third light emitting element ED3, and the fourth light emitting element ED4 disposed in the current flow path may emit light from the portion where the second light emitting element ED2 is disposed.

In this case, when a short circuit occurs in the connection electrode to which the anode signal is applied, the light emitting element ED of the corresponding portion may also emit light, but in an opposite case, the light emitting element ED of the corresponding portion may not emit light, and then the light emitting elements disposed in the current flow path may emit light. For example, when the third connection electrode CNE3 is short-circuited with the first electrode RME1, the third light emitting element ED3 and the fourth light emitting element ED4 may normally emit light.

As described above, by separating the first electrode RME1 and the second electrode RME2 at the separation portion RMO, respectively, and connecting the first portion RME1*a* of the first electrode RME1 and the first connection electrode CNE1, the same driving current may be applied thereto from the first transistor ST1. Even if any one of the first electrode RME1 and the connection electrodes CNE1, CNE2, CNE3, CNE4, and CNE5 is short-circuited, because the driving current is applied to the short-circuited connection electrode from the first electrode RME1, some light emitting elements ED may normally emit light. Therefore, a dark spot or bright spot defect may not occur in one sub-pixel due to a short circuit of the electrodes.

In concluding the detailed description, those skilled in the art will appreciate that many variations and modifications can be made to the embodiments described herein without substantially departing from the present disclosure. Therefore, the embodiments of the present disclosure are to be understood in a generic and descriptive sense and not for purposes of limitation.

What is claimed is:

1. A display device comprising:

a substrate;

a first transistor on the substrate;

first and second electrodes on the first transistor and extending in one direction and spaced apart from each other;

a first insulating layer on the first and second electrodes;

a light emitting element on the first insulating layer and over the first electrode and the second electrode; and a first connection electrode on the first insulating layer and in contact with one end of the light emitting element, and a second connection electrode on the first insulating layer and in contact with another end of the light emitting element, wherein the first electrode and the second electrode are spaced apart from the first transistor, wherein a first end of the first connection electrode is in contact with the one end of the light emitting element, and a second end of the first connection electrode is connected to the first transistor via a first contact hole in the first insulating layer and is connected to the first electrode via a second contact hole in the first insulating layer, and wherein the first and second contact holes in the first insulating layer are spaced apart from each other.

2. The display device of claim 1, wherein the first electrode has a first portion overlapping the first connection electrode and a second portion spaced apart from the first portion and not overlapping the first connection electrode.

3. The display device of claim 2, further comprising:

a first voltage line configured to supply a high potential voltage to the first transistor;

a horizontal voltage line crossing the first voltage line and configured to supply a low potential voltage; and a first vertical voltage line crossing the horizontal voltage line and configured to receive the low potential voltage from the horizontal voltage line, wherein the second portion of the first electrode is connected to the horizontal voltage line.

4. The display device of claim 3, wherein the first portion and the second portion of the first electrode overlap the first vertical voltage line.

5. The display device of claim 3, wherein the first connection electrode and the second connection electrode overlap the first vertical voltage line.

6. The display device of claim 2, wherein the first portion of the first electrode is connected to the first connection electrode to form an equipotential.

7. The display device of claim 2, wherein the first portion and the second portion of the first electrode are formed in an island shape, and wherein the second electrode is a floating electrode.

8. The display device of claim 1, wherein the first connection electrode has:

a first horizontal portion extending from the second electrode to the first electrode;

a first vertical portion extending in a crossing direction from the first horizontal portion;

a second horizontal portion extending parallel to the first horizontal portion from the first vertical portion; and a second vertical portion extending parallel to the first vertical portion from the second horizontal portion.

9. The display device of claim 8, wherein the first horizontal portion connects the first transistor and the first electrode, and wherein the second vertical portion is in contact with one end of the light emitting element.

10. The display device of claim 8, wherein the first horizontal portion and the second vertical portion overlap the first electrode.

11. A display device comprising:

a substrate;

a horizontal voltage line on the substrate and extending in a first direction;

a first vertical voltage line extending in a second direction crossing the first direction and connected to the horizontal voltage line;

first and second electrodes extending in the second direction and spaced apart from each other on the horizontal voltage line and the first vertical voltage line; and a first connection electrode and a second connection electrode on the first electrode and the second electrode and overlapping the second electrode, wherein the first connection electrode has, in a plan view, a first horizontal portion extending in the first direction, a first vertical portion extending in the second direction from the first horizontal portion, a second horizontal portion extending parallel to the first horizontal portion from the first vertical portion, and a second vertical portion extending parallel to the first vertical portion from the second horizontal portion, wherein the second connection electrode is between the first vertical portion of the first connection electrode and the second vertical portion of the first connection electrode in the plan view, and wherein the first horizontal portion and the second vertical portion overlap the first electrode and the first vertical voltage line.

12. The display device of claim 11, further comprising a first transistor configured to supply a driving current to the first connection electrode, wherein one end of the first horizontal portion is connected to the first transistor, and wherein another end of the first horizontal portion is connected to the first electrode.

13. The display device of claim 12, further comprising a plurality of light emitting elements aligned between the first electrode and the second electrode, wherein the first transistor is configured to suppl the driving current to the plurality of light emitting elements through the first connection electrode.

14. The display device of claim 12, further comprising:

a gate line extending in the first direction;

a first data line extending in the second direction and crossing the gate line;

a second transistor at where the gate line and the first data line cross each other; and a first capacitor between the first transistor and the second transistor.

15. The display device of claim 14, wherein the first vertical portion overlaps the first capacitor and the first transistor, and wherein the second horizontal portion overlaps the second transistor and the first data line.

16. The display device of claim 11, further comprising:

a third connection electrode facing the second connection electrode;

a fourth connection electrode facing the third connection electrode; and a fifth connection electrode facing the fourth connection electrode, wherein the third connection electrode and the fourth connection electrode overlap the second electrode.

17. The display device of claim 16, further comprising:

a first light emitting element connected to the first connection electrode and the second connection electrode;

a second light emitting element connected to the second connection electrode and the third connection electrode;

a third light emitting element connected to the third connection electrode and the fourth connection electrode; and a fourth light emitting element connected to the fourth connection electrode and the fifth connection electrode.

18. The display device of claim 17, wherein the fifth connection electrode is connected to the horizontal voltage line.

19. The display device of claim 11, wherein the first electrode has a first portion overlapping the first connection electrode and a second portion spaced apart from the first portion and not overlapping the first connection electrode, wherein the second portion connects the horizontal voltage line and the first vertical voltage line, wherein the first portion of the first electrode is connected to the first connection electrode to form an equipotential, and wherein the second electrode is a floating electrode.

20. An electronic device comprising:

a substrate;

a first transistor on the substrate;

first and second electrodes on the first transistor and extending in one direction and spaced apart from each other;

a first insulating layer on the first and second electrodes;

a light emitting element on the first insulating layer and over the first electrode and the second electrode; and a first connection electrode on the first insulating layer and in contact with one end of the light emitting element, and a second connection electrode on the first insulating layer and in contact with another end of the light emitting element, wherein the first electrode and the second electrode are spaced apart from the first transistor, wherein a first end of the first connection electrode is in contact with the one end of the light emitting element, and a second end of the first connection electrode is connected to the first transistor via a first contact hole in the first insulating layer and is connected to the first electrode via a second contact hole in the first insulating layer, and wherein the first and second contact holes in the first insulating layer are spaced apart from each other.

* * * * *